United States Patent
You et al.

(10) Patent No.: US 7,741,222 B2
(45) Date of Patent: Jun. 22, 2010

(54) ETCH STOP STRUCTURE AND METHOD OF MANUFACTURE, AND SEMICONDUCTOR DEVICE AND METHOD OF MANUFACTURE

(75) Inventors: Young-Sub You, Kyungi-Do (KR); Jae-Young Park, Kyungi-Do (KR); Won-Shik Shin, Kyungi-Do (KR); Hyeon-Deok Lee, Seoul (KR); Ki-Vin Im, Seoul (KR); Seok-Woo Nam, Kyungi-Do (KR); Hun-Young Lim, Kyungi-Do (KR); Won-Jun Jang, Seoul (KR); Yong-Woo Hyung, Kyungi-Do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1368 days.

(21) Appl. No.: 11/102,849

(22) Filed: Apr. 11, 2005

(65) Prior Publication Data
US 2006/0084275 A1    Apr. 20, 2006

(30) Foreign Application Priority Data
Oct. 14, 2004    (KR) ................ 10-2004-0082048

(51) Int. Cl.
*H01L 21/302*    (2006.01)
(52) U.S. Cl. ................ 438/700; 438/634; 438/637; 438/704; 438/715; 438/740; 438/745; 216/57; 216/72
(58) Field of Classification Search ........ 438/704, 438/710, 722, 724, 740, 751, 754, 757, 240, 438/243, 388
See application file for complete search history.

(56) References Cited

U.S. PATENT DOCUMENTS

| 5,337,207 | A  | * | 8/1994  | Jones et al. ............ 361/321.1 |
| 5,698,468 | A  | * | 12/1997 | Kapoor ................... 438/664 |
| 5,783,483 | A  |   | 7/1998  | Gardner |
| 6,500,763 | B2 | * | 12/2002 | Kim et al. ............... 438/689 |
| 6,660,580 | B2 | * | 12/2003 | Lee ....................... 438/240 |
| 6,667,209 | B2 |   | 12/2003 | Won et al. |
| 6,815,221 | B2 | * | 11/2004 | Kim et al. ............... 438/3 |
| 6,828,229 | B2 | * | 12/2004 | Lee et al. ............... 438/638 |
| 6,897,106 | B2 | * | 5/2005  | Park et al. .............. 438/240 |
| 7,425,512 | B2 | * | 9/2008  | Udayakumar et al. ..... 438/740 |
| 7,494,940 | B2 | * | 2/2009  | Doh et al. ............... 438/785 |
| 2003/0054605 | A1 | * | 3/2003 | Kim et al. ............. 438/240 |
| 2003/0136996 | A1 |   | 7/2003 | Park |
| 2006/0076579 | A1 | * | 4/2006 | Thean et al. ........... 257/213 |

FOREIGN PATENT DOCUMENTS

| DE | 10257669 | | 7/2003 |
| EP | 1394848 | | 3/2004 |
| JP | 2001-237400 | | 8/2001 |
| JP | 2008283202 A | * | 11/2008 |
| KR | 1020050073211 A | | 7/2005 |

* cited by examiner

*Primary Examiner*—Anita K Alanko
(74) *Attorney, Agent, or Firm*—Volentine & Whitt, PLLC

(57) ABSTRACT

An etch stop layer is formed over a first structure by depositing a metal oxide material over the first structure and annealing the deposited metal oxide material. A second structure is formed over the etch stop layer, and a formation is etched through the second structure using the etch stop layer as an etch stop.

11 Claims, 29 Drawing Sheets

| | NO HEAT TREATMENT HfO2, Al2O3 LAYERS | | | HEAT TREATMENTS (200℃ - 900℃) HfO2, Al2O3 LAYERS | | |
|---|---|---|---|---|---|---|
| ETCHANT | 200:1 HF | SC1 | H2SO4 | 200:1 HF | SC1 | H2SO4 |
| ETCH TIME | 30 SEC | 30 MIN | 10 MIN | 30 SEC | 30 MIN | 10 MIN |
| ETCH RATE | 34.39 Å/MIN | 1.07 Å/MIN | 103.39 Å/MIN | 0.00 Å/MIN | 0.00 Å/MIN | 0.00 Å/MIN |

FIG. 2

ETCH STOP STRUCTURE AND METHOD OF MANUFACTURE, AND SEMICONDUCTOR DEVICE AND METHOD OF MANUFACTURE

BACKGROUND OF THE INVENTION

1. Field of the Invention

The present invention generally relates to the field of semiconductor devices, and more particularly, the present invention relates to etch stop structures and methods utilized in the manufacture of semiconductor devices.

2. Description of the Related Art

The use of etch stop layers in the manufacture of semiconductor devices is well known in the art. In addition to signaling the termination point of an etching process used to remove an overlying layer or layers, the etch stop layer functions to protect any underlying layer or layers during the etching process. However, one drawback encountered with the conventional use of etch stop layers occurs when an edge of the etch stop layer abuts against a conductive layer during wet etching of a layer formed over the etch stop layer. In this case, the etchant used in the wet etch process can permeate between the etch stop layer and the conductive layer, thus causing damage to the layer or layers underlying the etch stop layer. An example of this problem is presented below in the context of the manufacture of a cylindrical memory cell capacitor.

FIGS. 1A through 1F are schematic cross-sectional views for explaining a method of manufacturing a memory cell in which the lower electrode of the capacitor thereof has a cylindrical structure. Referring initially to FIG. 1A, a plurality of impurity regions (not shown) are formed in the surface of a semiconductor substrate 5. An interlayer dielectric (ILD) 10 is then formed over the substrate 5, and contact pad holes 15 are selectively etched in the ILD 10 to expose the respective impurity regions. The contact holes 15 are then filled with respective contact pads 20. Then, a first etch stop layer 25, a support insulator layer 30, a second etch stop layer 35, a mold layer 40, and an anti-reflection film 45 are successively formed over the ILD 10 as shown. The first and second etch stop layers 25 and 35 are typically formed of silicon nitride ($Si_3N_4$).

Then, as illustrated in FIG. 1B, a photoresist film pattern 50 is formed over the anti-reflection film 45, and thereafter the anti-reflection film 45, the mold layer 40, the second etch stop layer 35, the support insulator layer 30, and the first etch stop layer 25 are all etched to define node holes 55 which expose the respective contact pads 20. Here, the etching process typically both dry etch and wet etch processes. In this case, referring to FIG. 1C, sidewall portions of the mold layer 40 and support insulator layer 30 may be eroded, resulting in the protrusion of the exposed edges of the first and second etch stop layers 25 and 35. Likewise, an upper surface portion of the ILD 10 may be removed by the wet etching, resulting in the protrusion of the upper end of the contact pad 20 from the surface of the ILD 10.

Referring still to FIG. 1C, a storage node 60 is conformably formed on sidewall and bottom walls of the node hole 55 (FIG. 1B). The storage node 60 is typically form of titanium nitride (TiN). Then, a sacrificial layer 65 is formed on the resultant structure to as to fill the node hole 55.

Then, as illustrated in FIG. 1D, the sacrificial layer 65 and the storage node 60 are planarized (typically by CMP) to expose the upper surface portion of the mold layer 40. In FIG. 1D, the planarized sacrificial layer is identified by reference number 75, and the planarized storage node is identified by reference number 70.

Referring next to FIG. 1E, a wet etch process is executed to remove the mold layer 40 (FIG. 1D) and the sacrificial layer 75 (FIG. 1D). The wet etchant used in this process must exhibit etch selectivity with respect to the storage node 70 and the silicon nitride etch stop layer 35. Unfortunately, however, in practice the silicon nitride etch stop layers 35 and 25 are easily eroded by the wet etchant used to remove the mold and sacrificial layers. As a result, referring to reference numbers A1 and A2 of FIG. 1E, the wet etchant tends to permeate between the storage node 70 and the etch stop layers 35 and 25, thus damaging the underlying insulating layer 30 and ILD 10, respectively.

Turing now to FIG. 1F, the memory cell is essentially completed by conformally depositing a dielectric layer 80 on the exposed surfaces of the storage node 70, and by then forming a plate node layer 85 on the resultant structure as shown. Note that the capacitive element 90 of the memory cell is constituted by the storage node 70, the dielectric layer 80, and the plate node layer 85.

As described above, the use of conventional etch stop layers may result in fabrication problems. For example, problems occur when an edge of a conventional etch stop layer abuts against a conductive layer during wet etching of a layer formed over the etch stop layer. In the case of fabricating a cylindrical capacitor electrode, the wet etchant may permeate between the etch stop layer and a storage node during removal of mold and sacrificial layers, thus causing damage to the layer or layers underlying the etch stop layer.

SUMMARY OF THE INVENTION

According to an aspect of the present invention, a method of manufacturing a semiconductor device is provided which includes forming an etch stop layer over a first structure by depositing a metal oxide material over the first structure and annealing the deposited metal oxide material, forming a second structure over the etch stop layer, and etching a formation through the second structure using the etch stop layer as an etch stop.

According to another aspect of the present invention, a method of forming an etch stop layer which is substantially resistant to wet etching is provided which includes depositing a metal oxide material on an underlying structure, and annealing the deposited metal oxide material to obtain the etch stop layer.

According to yet another aspect of the present invention, a method of manufacturing a semiconductor device is provided which includes forming a first interlayer dielectric (ILD) layer over the surface of a substrate, forming a first conductive layer within a first contact hole of the first ILD layer, forming an etch stop layer over the first ILD layer and the first conductive layer, where the etch stop layer is formed by depositing a metal oxide material and annealing the deposited metal oxide material, forming a second ILD layer over the etch stop layer, etching a second contact hole in the second ILD layer using the etch stop layer as an etch stop, where the second contact hole is aligned over the first conductive layer, removing an exposed portion of the etch stop layer within the second contact hole, and forming a second conductive layer in the second contact hole which electrically contacts the first conductive layer.

According to still another aspect of the present invention, a method of manufacturing a semiconductor device is provided which includes forming first and second gate structures spaced apart over the surface of a substrate, and a first conductive layer located between the first and second gate structures over the surface of the substrate, forming a first interlayer dielectric (ILD) layer over the first and second gate structures and the first conductive layer, forming an etch stop layer over the first ILD layer, where the etch stop layer is formed by depositing a metal oxide material, and annealing the deposited metal oxide material, forming a second ILD layer over the etch stop layer, etching a first contact hole in the second ILD layer using the etch stop layer as an etch stop, where the first contact hole is aligned over the conductive layer, removing an exposed portion of the etch stop layer within the first contact hole and forming a second contact hole, which is aligned with the first contact hole, within the first ILD layer to expose the first conductive layer, and forming a second conductive layer within the first and second contact holes which electrically contacts the first conductive layer.

According to another aspect of the present invention, a method of manufacturing a semiconductor device is provided which includes forming first and second gate structures spaced apart over the surface of a substrate, and a first conductive layer located between the first and second gate structures over the surface of the substrate, forming a first interlayer dielectric (ILD) layer over the first and second gate structures and the first conductive layer, forming a second conductive layer which extends through the first ILD layer and electrically contacts the first conductive layer, forming a second ILD layer over the second conductive layer and the first ILD layer, forming an etch stop layer over the second ILD layer, where the etch stop layer is formed by depositing a metal oxide material and annealing the deposited metal oxide material, forming a mold layer over the etch stop layer, etching a capacitor electrode formation in the mold layer, the etch stop layer and the second ILD layer so as to expose the second conductive layer, forming a first capacitor electrode in the capacitor electrode formation, etching the mold layer to remove the mold layer using the etch stop layer as an etch stop, and forming a dielectric layer and a second capacitor electrode in the capacitor electrode formation.

According to yet another aspect of the present invention, a semiconductor device is provided which includes a first structure, a second structure formed over the first structure, and an etch stop layer interposed between the first and second structures, where the etch stop layer comprises an annealed metal oxide layer which is substantially resistant to a wet etching.

BRIEF DESCRIPTION OF THE DRAWINGS

The above and other aspects and features of the present invention will become readily apparent from the detailed description that follows, with reference to the accompanying drawings, in which:

FIG. 2 is a table for explaining the effect on etch rate of subjecting an etch stop layer of an embodiment of the present invention to heat treatment;

DETAILED DESCRIPTION OF PREFERRED EMBODIMENTS

Figure 1A:
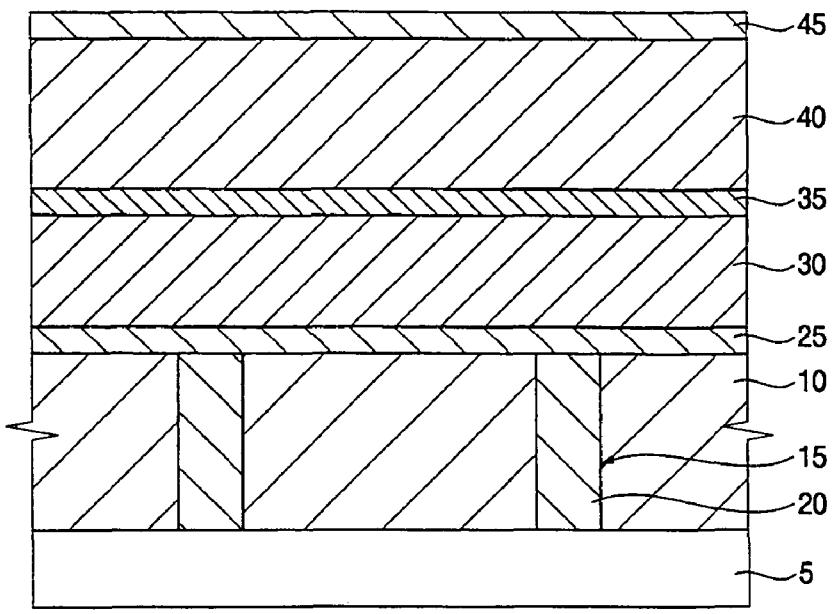
FIGS. 1A through 1F are schematic cross-sectional views for explaining a conventional method of manufacturing a memory cell having a cylindrical capacitor electrode.
Figure 1B:
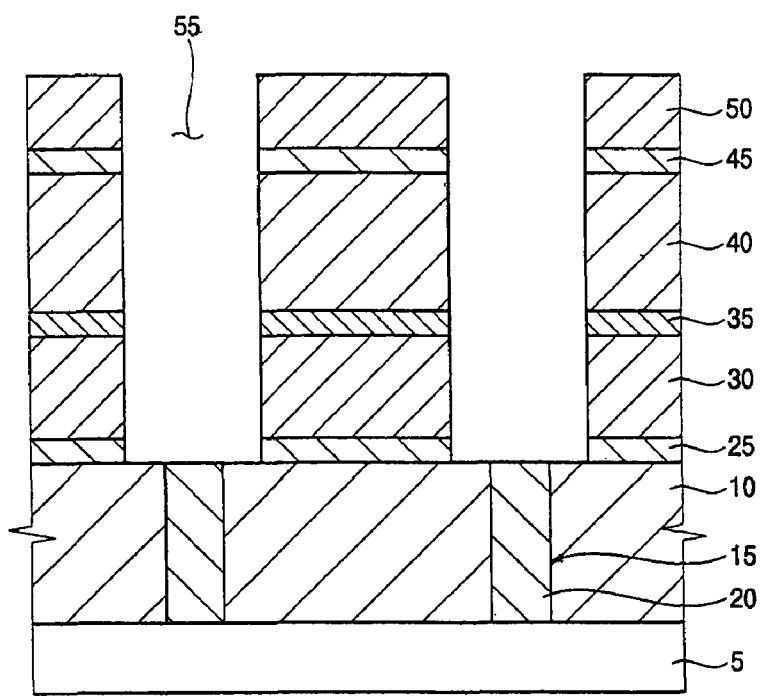
Figure 1C:
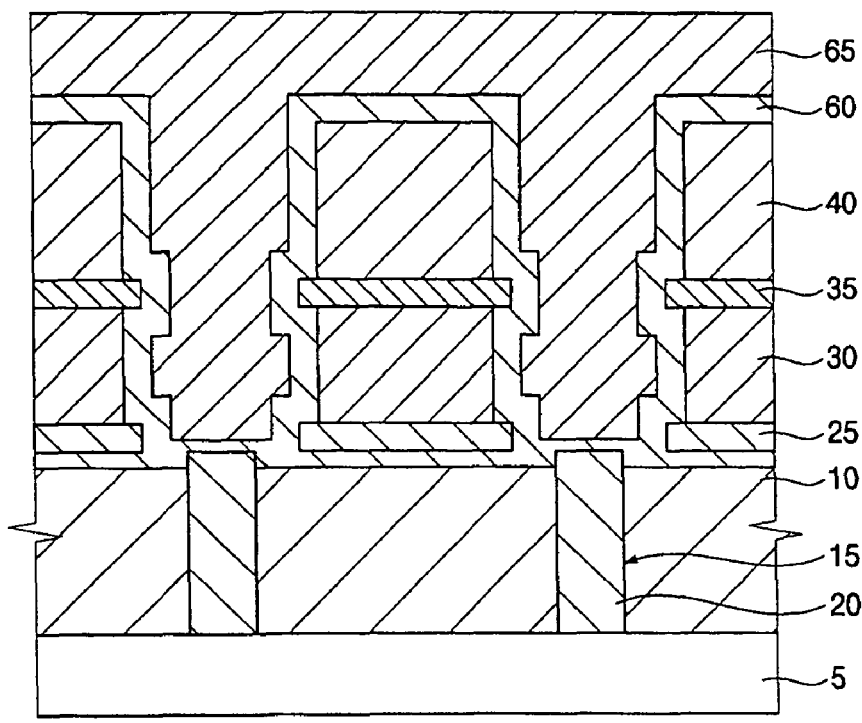
Figure 1D:
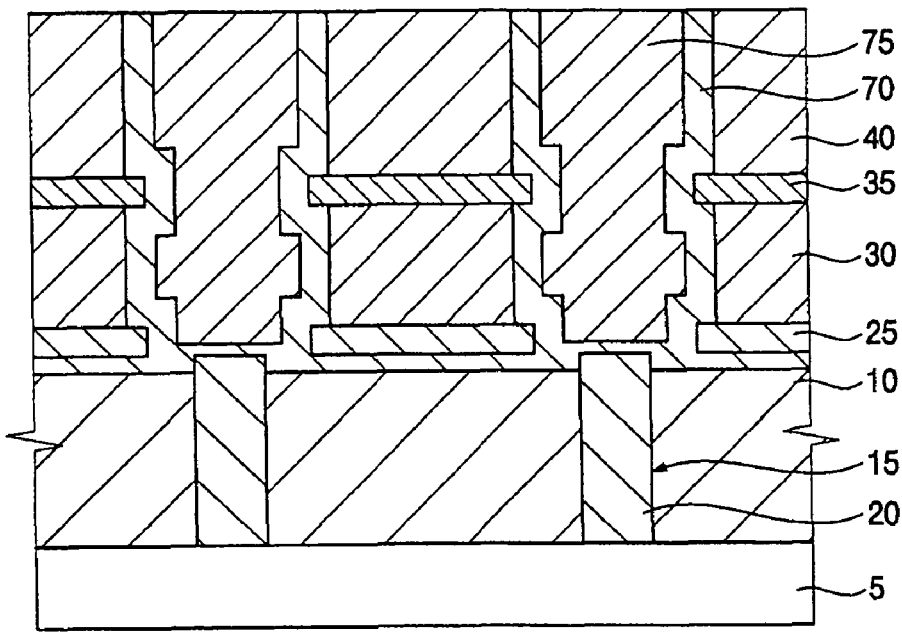
Figure 1E:
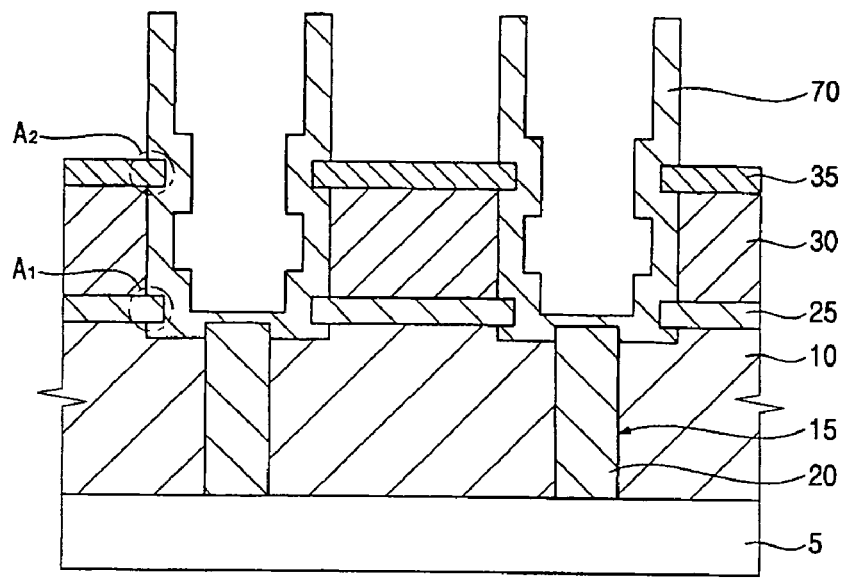
Figure 1F:
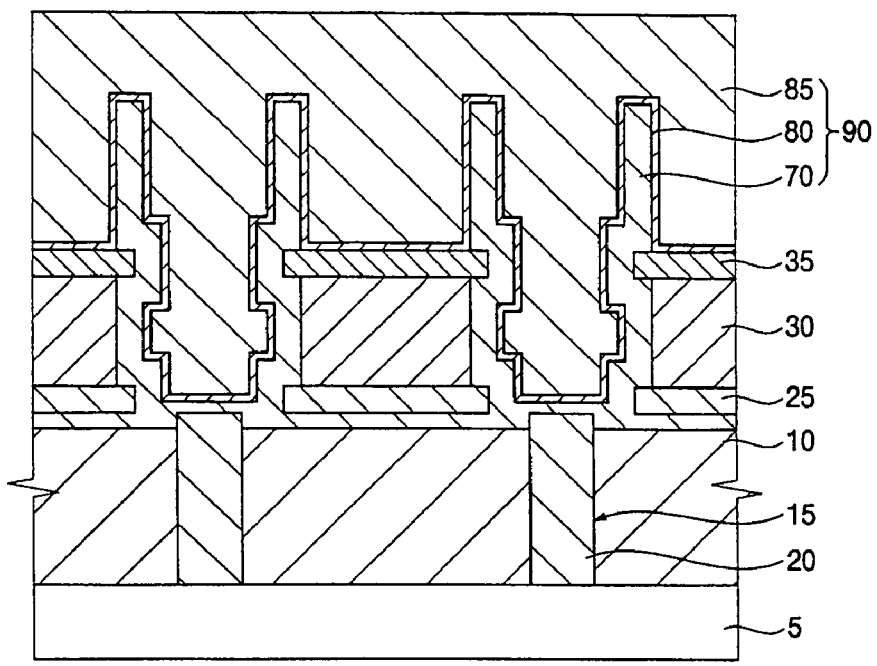

The present invention is at least partially characterized by an etch stop layer that is resistant to wet etching and that includes at least one layer containing an annealed metal oxide material. As discussed previously, conventional etch stop layers are typically formed of silicon nitride. In order to obtain the desired etch selectivity (i.e., to decrease the etch rate of the silicon nitride), it is necessary to subject the silicon nitride material to a high temperature thermal anneal, typically at a temperature of around 750° C. Such temperatures tend to strain the thermal budget during fabrication. Further, notwithstanding the high temperature anneal, the etch rate of the silicon nitride can be insufficient to prevent etch stop erosion and permeation of the wet etchant into underlying layers.

Certain aspects of the invention stem from the discovery that low temperature anneals of metal oxide materials can achieve etch selectivities which are comparable to, or better than, high temperature annealed silicon nitride. In this regard, reference is made to the table illustrated in FIG. 2. As shown, etch rates of non-annealed hafnium oxide ($HfO_2$) and aluminum oxide ($Al_2O_3$) were measured using three different wet etchants, namely, 200:1 diluted hydrofluoric acid (HF), Standard Clean 1 (SC1: ammonium hydroxide ($NH_4OH$), hydrogen peroxide ($H_2O_2$) and water), and sulfuric acid ($H_2SO_4$). The etch time for the HF and SC1 was thirty minutes, while the etch time for the sulfuric acid was ten minutes. In the absence of the thermal anneal, the etch rates ranged from 103.39 Å/minute for the sulfuric acid to 1.07 Å/minute for the SC1. The remainder of the table of FIG. 2 shows the etch rates of hafnium oxide and aluminum oxide layers that have been subjected to thermal anneal temperatures ranging from 200° C. to 900° C. Again, the etch time for the HF and SC1 was thirty minutes, while the etch time for the sulfuric acid was ten minutes. As shown, the thermal anneal resulted in extremely low etch rates which were measured at 0.00 Å/minute. Accordingly, even at temperatures as low as 200° C., highly favorable wet etch stop characteristics can be achieved.

It should also be pointed out that the adopted anneal temperature is partly dependent on the anneal time. However, the anneal time for a metal oxide material can be substantially reduced when compared to that utilized for silicon nitride. For example, to form an etch stop layer, silicon nitride is typically annealed for about one hour (60 minutes) at about 750° C. In contrast, metal oxide layers, such as hafnium oxide and aluminum oxide layers, need only be annealed for about 1 minute at about 500° C. to obtain favorable wet etch stop characteristics.

The present invention will now be explained by way of preferred, but non-limiting, embodiments of the invention. It is noted that the drawings are not necessarily drawn to scale, and that relative thicknesses and relative widths of component parts may be exaggerated for clarity of the description.

FIGS. 3A through 3D are schematic cross-sectional views for explaining a method of manufacturing a semiconductor device according to an embodiment of the present invention.

Figure 3A:
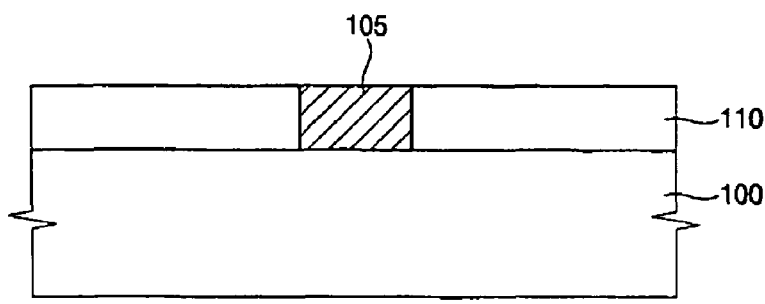
FIGS. 3A through 3D are schematic cross-sectional views for explaining a method of manufacturing a semiconductor device according to an embodiment of the present invention.

Referring first to FIG. 3A, a semiconductor substrate 100 is prepared so as to include one or more impurity regions (not shown) in the surface thereof. An interlayer dielectric (ILD) layer 110 is formed over the substrate 100, and is then selectively etched through a patterned mask layer (not shown) to define a contact hole which exposes one of the impurity regions of the substrate 100. The contact hole is then filled with a first conductive pattern 105 to obtain the structure illustrated in FIG. 3A. This may, for example, be realized by depositing a conductive material layer over the entire structure, and then planarizing the layer so as to expose an upper surface of the ILD layer 110.

Figure 3B:
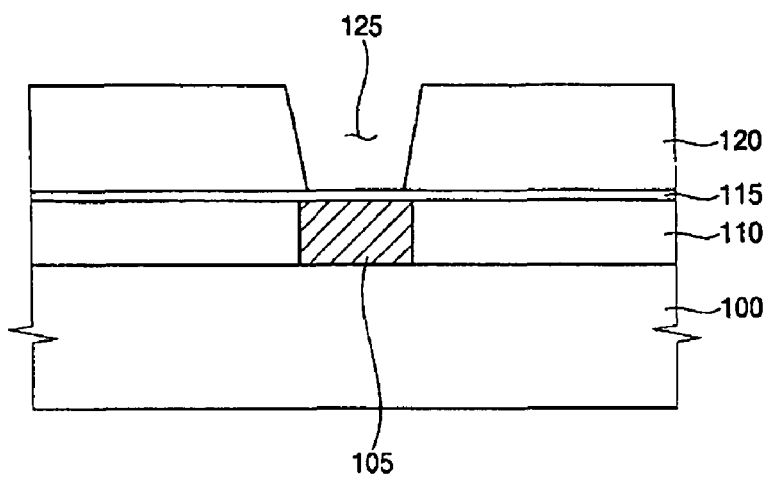

Next, referring to FIG. 3B, an etch stop layer 115 and second ILD layer 120 are sequentially formed over the first ILD 110 and the first conductive layer 105. A patterned mask layer (not shown) is then formed, and the resultant structure is subjected to a wet etching process so as to selectively expose a portion of the etch stop layer 115. Then, the exposed portion of the etch stop layer 115 is removed by a dry etching process. As a result, a contact hole 125 is defined in the second ILD 120 and the etch stop layer 115. As shown in FIG. 3B, the contact hole 125 is aligned over the first conductive pattern 105.

The etch stop layer 115 is formed by depositing and annealing a metal oxide material. For example, the metal oxide material may include hafnium and/or aluminum. In the case of hafnium, for example, the metal oxide material may be hafnium oxide ($HfO_2$). In the case of aluminum, for example, the metal oxide material may be aluminum oxide ($Al_2O_3$). As non-limiting examples only, a hafnium oxide layer may be annealed at about 510° C. for about 1 minute, and an aluminum oxide material may be annealed at about 500° C. for about 1 minute.

The metal oxide etch stop layer 115 may, for example, be deposited by atomic layer deposition (ALD).

Also, as explained previously, annealing of the metal oxide etch stop layer 115 substantially decreases the etch rate of the etch stop layer 115 during wet etching of the second ILD layer 120. As such, erosion of the etch stop layer 115 is reduced, thus reducing the possibility that wet etchant will permeate between the first conductive pattern 105 and the first ILD 110. The result is improved device reliability and device yields.

The annealing of the metal oxide etch stop layer 115 may take place either before or after the second ILD layer 120 is formed. Also, the etch stop layer 115 may be formed directly on the first ILD layer 110, or instead one or more layers may be interposed between the etch stop layer 115 and the first ILD layer 110. Likewise, the second ILD layer 120 may be formed directly on the etch stop layer 115, or instead one or more layers may be interposed between the second ILD layer 120 and the etch stop layer 115.

Figure 3C:
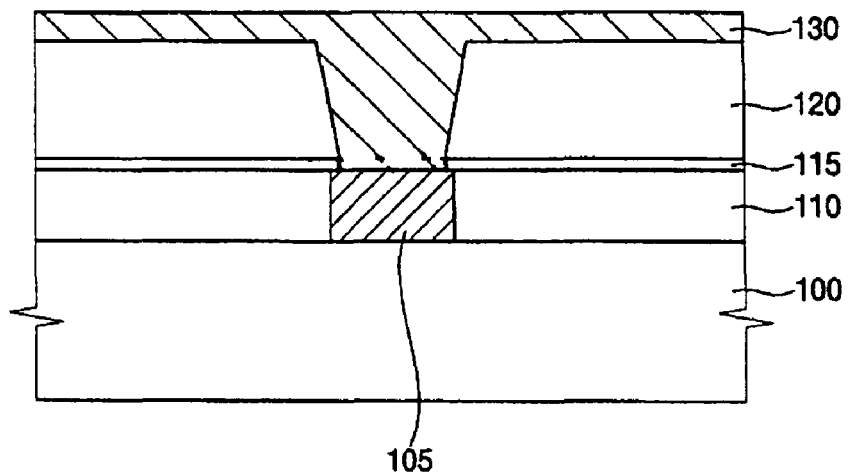
Figure 3D:
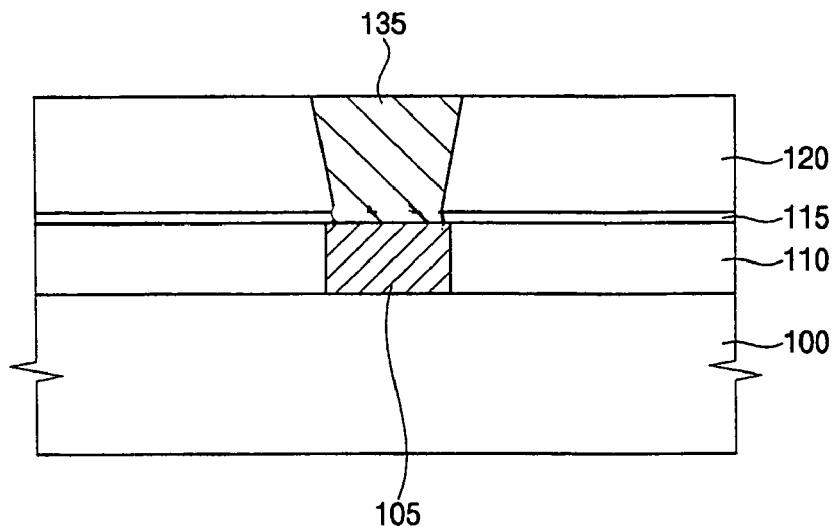

Turning now to FIG. 3C, a second conductive layer 130 is deposited over the structure illustrated in FIG. 3B. As shown, the second conductive layer 130 fills the contact hole 125 and electrically contacts the first conductive pattern 105.

Finally, the second conductive layer 130 is planarized, for example by chemical mechanical polishing (CMP), to expose a top surface of the second ILD layer 120. As a result, a second conductive pattern 135 is defined within the second ILD layer 120 and in electrical contact with the first conductive pattern 105.

Figure 4A:
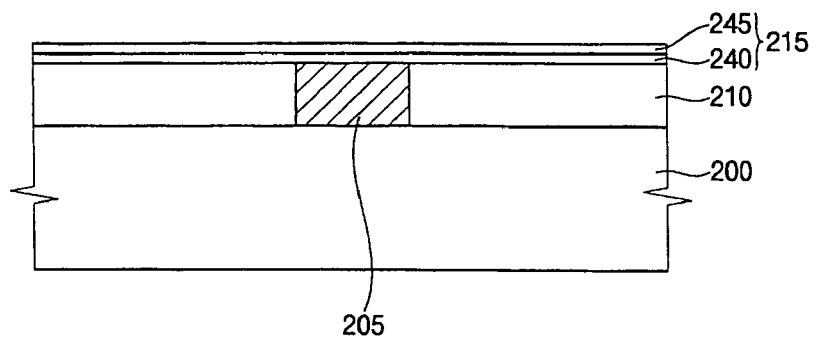
FIGS. 4A through 4C are schematic cross-sectional views for explaining a method of manufacturing a semiconductor device according to another embodiment of the present invention.
Figure 4B:
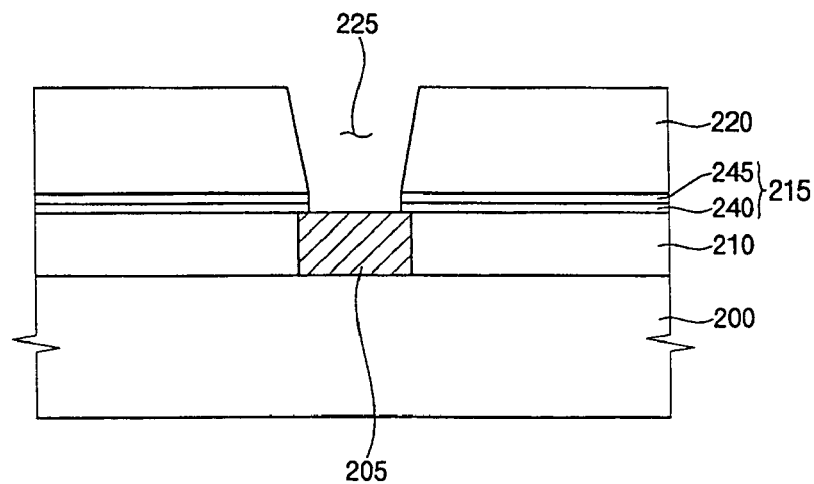
Figure 4C:
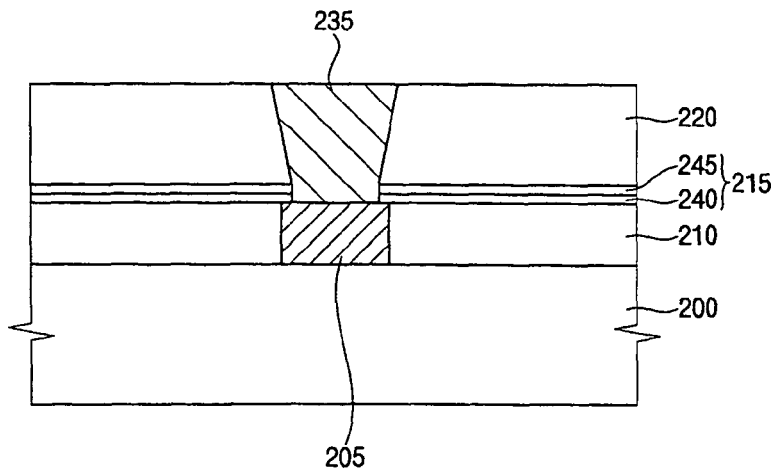

FIGS. 4A through 4C are schematic cross-sectional views for explaining a method of manufacturing a semiconductor device according to another embodiment of the present invention.

Referring first to FIG. 4A, a semiconductor substrate 200 is prepared so as to include one or more impurity regions (not shown) in the surface thereof. An interlayer dielectric (ILD) layer 210 is formed over the substrate 200, and the then the first ILD layer 210 is selectively etched through a patterned mask layer (not shown) to define a contact hole which exposes one of the impurity regions of the substrate 200. The contact hole is then filled with a first conductive pattern 205. This may, for example, be realized by depositing a conductive material layer over the entire structure, and then planarizing the layer so as to expose an upper surface of the first ILD layer 210.

A multilayer etch stop 215 is then formed over the first ILD layer 210 and the first conductive pattern 205, thus obtaining the structure illustrated in FIG. 4A. In the example of this embodiment, the multilayer etch stop 215 includes first and second etch stop layers 240 and 245.

Either one or both of the first and second etch stop layers 240 and 245 is formed by depositing and annealing a metal oxide material. In the case where both of the first and second etch stop layers 240 and 245 are formed of annealed metal oxide, different metal oxide materials may be adopted for each layer. For example, the metal oxide material or materials may include hafnium and/or aluminum. In the case of hafnium, for example, the metal oxide material may be hafnium oxide ($HfO_2$). In the case of aluminum, for example, the metal oxide material may be aluminum oxide ($Al_2O_3$). As a non-limiting example only, the hafnium oxide and/or aluminum oxide layers may be annealed at about 500 to 510° C. for about 1 minute.

Alternately, one of the first and second etch stop layers 240 and 245 may be formed of an annealed metal oxide, while the other of the first and second layers 240 and 245 may be formed of a non-metal-oxide material, an example of which is silicon nitride.

In a specific example of the present embodiment, the first etch stop layer 240 is one of annealed hafnium oxide ($HfO_2$) and annealed aluminum oxide ($Al_2O_3$), and the second etch stop layer 245 is the other of annealed hafnium oxide ($HfO_2$) and annealed aluminum oxide ($Al_2O_3$). In another specific example of the present embodiment, the first etch stop layer 240 is silicon nitride, and the second etch stop layer 245 is one of annealed hafnium oxide ($HfO_2$) and annealed aluminum oxide ($Al_2O_3$).

The metal oxide etch stop layers 240 and/or 245 may, for example, be deposited by atomic layer deposition (ALD).

Turning now to FIG. 4B, a second ILD layer 120 is formed over the multilayer etch stop 215. A patterned mask layer (not shown) is then formed, and the resultant structure is subjected to a wet etching process so as to selectively expose a portion of the multilayer etch stop 215. Then, the exposed portion of the multilayer etch stop 215 is removed by a dry etching process. As a result, a contact hole 225 is defined in the second ILD 220 and the multilayer etch stop 215. As shown, the contact hole 225 is aligned over the first conductive pattern 205.

The annealing of the metal oxide etch stop layer 240 and/or 245 may take place either before or after the second ILD layer 220 is formed. Also, the first etch stop layer 240 may be formed directly on the first ILD layer 210, or instead one or more layers may be interposed between the first etch stop layer 240 and the first ILD layer 210. Likewise, the second ILD layer 220 may be formed directly on the second etch stop layer 245, or instead one or more layers may be interposed between the second ILD layer 220 and the second etch stop layer 245. Finally, the second etch stop layer 245 may be formed directly on the first etch stop layer 240, or instead one or more layers may be interposed between the second etch stop layer 245 and the first etch stop layer 240.

Turning now to FIG. 4C, a second conductive pattern 235 is formed in the contact hole 225 (FIG. 3B). This may be accomplished in the same manner as described above in connection with FIGS. 2C and 2D. As shown in FIG. 4C, the second conductive pattern 235 is defined within the second ILD layer 220 and in electrical contact with the first conductive pattern 205.

As explained previously, the annealed metal oxide etch stop layer 240 and/or 245 exhibits a low wet etch rate. As such, erosion of the etch stop layer 240 and/or 245 is reduced during wet etching of the second ILD 220, thus reducing the possibility that wet etchant will permeate between the first conductive pattern 205 and the first ILD layer 210. The result is improved device reliability and device yields.

Figure 5A:
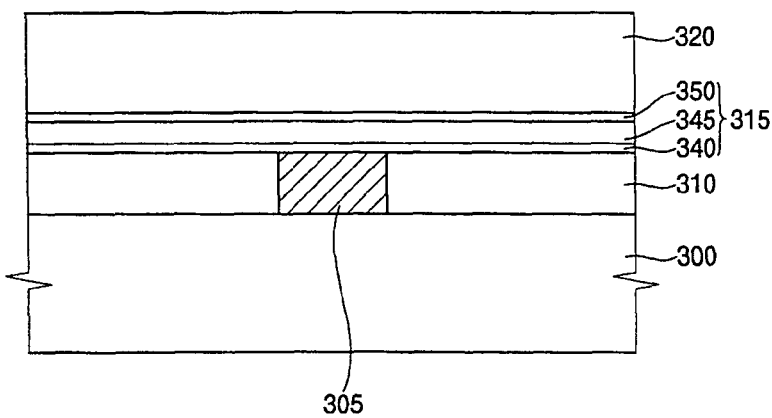
FIGS. 5A through 5B are schematic cross-sectional views for explaining a method of manufacturing a semiconductor device according to an embodiment of the present invention.
Figure 5B:
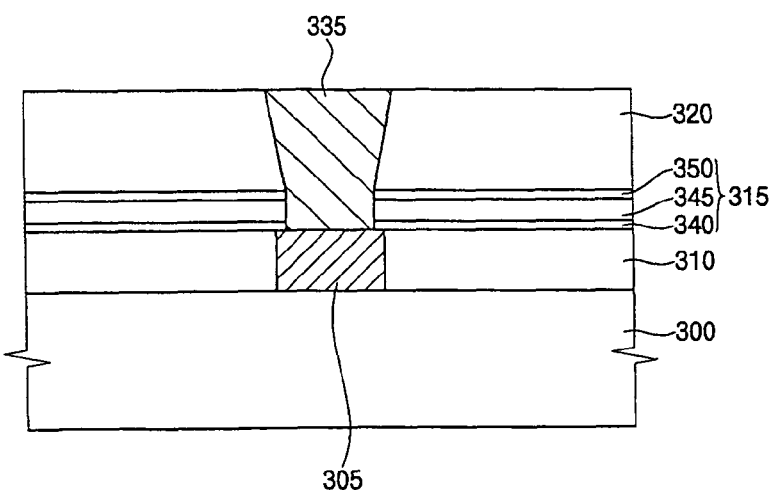

FIGS. 5A through 5B are schematic cross-sectional views for explaining a method of manufacturing a semiconductor device according to another embodiment of the present invention.

This embodiment is substantially the same as the prior embodiments, except for the structure of the etch stop layer. Accordingly, FIG. 5A illustrates a stacked structure in which a first conductive pattern 305 and a first ILD layer 310 are formed over a substrate 300, and in which an multilayer etch stop 315 and a second ILD 320 are sequentially stacked over the first conductive pattern 305 and the first ILD 310.

The multilayer etch stop 315 of this embodiment includes an oxide layer 345 interposed as a buffer between first and second etch stop layers 340 and 350. Either one or both of the first and second etch stop layers 340 and 350 is formed by depositing and annealing a metal oxide material. In the case where both of the first and second etch stop layers 340 and 350 are formed of annealed metal oxide, different metal oxide materials may be adopted for each layer. For example, the metal oxide material or materials may include hafnium and/or aluminum. In the case of hafnium, for example, the metal oxide material may be hafnium oxide ($HfO_2$). In the case of aluminum, for example, the metal oxide material may be aluminum oxide ($Al_2O_3$). As a non-limiting example only, the hafnium oxide and/or aluminum oxide layers may be annealed at about 500 to 510° C. for about 1 minute.

Alternately, one of the first and second etch stop layers 340 and 350 may be formed of an annealed metal oxide, while the other of the first and second layers 340 and 350 may be formed of a non-metal-oxide material, an example of which is silicon nitride.

In a specific example of the present embodiment, the first etch stop layer 340 is one of annealed hafnium oxide ($HfO_2$) and annealed aluminum oxide ($Al_2O_3$), and the second etch stop layer 350 is one of annealed hafnium oxide ($HfO_2$) and annealed aluminum oxide ($Al_2O_3$). In another specific example of the present embodiment, the first etch stop layer 340 is silicon nitride, and the second etch stop layer 350 is one of annealed hafnium oxide ($HfO_2$) and annealed aluminum oxide ($Al_2O_3$).

The metal oxide etch stop layers 340 and/or 350 may, for example, be deposited by atomic layer deposition (ALD).

A patterned mask layer (not shown) is formed on the second ILD 320, and the resultant structure is subjected to a wet etching process so as to selectively expose a portion of the multilayer etch stop 315. Then, the exposed portion of the multilayer etch stop 315 is removed by a dry etching process. As a result, a contact hole is defined in the second ILD 320 and the multilayer etch stop 315, and then a second conductive pattern 335 is formed in the contact hole. This may be accomplished in the same manner as described above in connection with FIGS. 3C and 3D. As shown in FIG. 5B, the second conductive pattern 335 is defined within the second ILD layer 320 and in electrical contact with the first conductive pattern 305.

The annealing of the metal oxide etch stop layer 340 and/or 350 may take place either before or after the second ILD layer 320 is formed. Also, the first etch stop layer 340 may be formed directly on the first ILD layer 310, or instead one or more layers may be interposed between the first etch stop layer 340 and the first ILD layer 310. Likewise, the second ILD layer 320 may be formed directly on the second etch stop layer 350, or instead one or more layers may be interposed between the second ILD layer 320 and the second etch stop layer 350. Finally, additional layers other than the oxide layer 345 may be interposed between the first and second etch stop layers 340 and 350.

As explained previously, the annealed metal oxide etch stop layer 340 and/or 350 exhibits a low wet etch rate. As such, erosion of the etch stop layer 340 and/or 350 is reduced during wet etching of the second ILD layer 320, thus reducing the possibility that wet etchant will permeate between the first conductive pattern 305 and the first ILD layer 310. The result is improved device reliability and device yields.

FIGS. 6A through 6E are schematic cross-sectional views for explaining a method of manufacturing a semiconductor device according to another embodiment of the present invention.

Figure 6A:
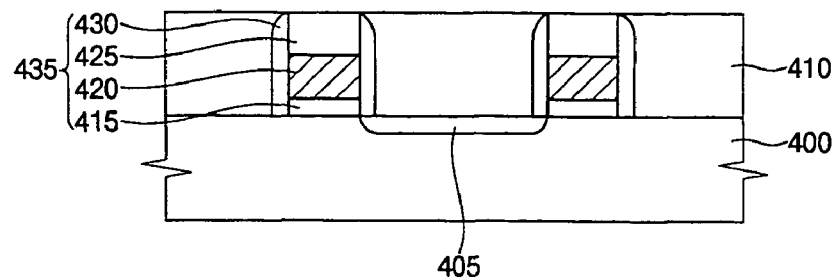
FIGS. 6A through 6E are schematic cross-sectional views for explaining a method of manufacturing a semiconductor device according to another embodiment of the present invention.

Initially, a structure as illustrated in FIG. 6A is prepared. As shown, a semiconductor substrate 400 includes an impurity region 405 in the surface thereof. Gate structures 435 are formed on the surface of the substrate 400 at opposite sides of the impurity region 405. Each of the gate structures 435 is generally formed of a gate oxide 415, a gate electrode 420, a nitride layer 425, and insulating sidewalls 430. Also, as shown, a first ILD layer 410 is formed with its top surface coplanar with the top surfaces of the gate structures 435.

Figure 6B:
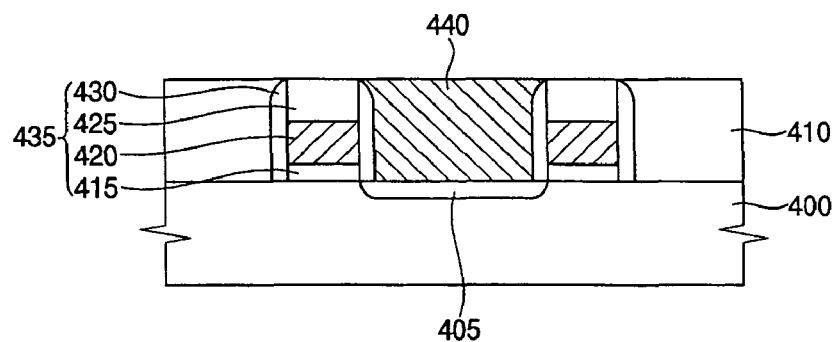

Next, as shown in FIG. 6B, a self-aligned contact hole is formed between the gate structures 435, and then filled with a first conductive pad 440. The first conductive pad electrically contacts the impurity region 405.

Figure 6C:
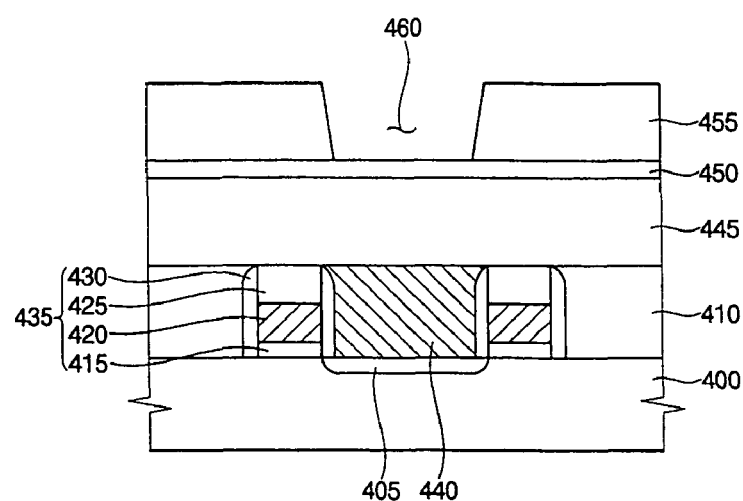

Then, as shown in FIG. 6C, a second ILD layer 445, an etch stop layer 450, and a third ILD layer 455 are sequentially formed over the structure of FIG. 6B.

The etch stop layer 450 of this embodiment is an annealed metal oxide layer and is the same as the etch stop layer 115 of the embodiment described previously in connection with FIGS. 3A through 3D. Accordingly, in an effort to avoid redundancy, reference is made to that earlier discussion. It should be noted that the entire discussion relating to the metal oxide etch stop layer 115 of the prior embodiment is applicable to etch stop layer 450 of this embodiment, including discussions relating to method of manufacture, layer materials, the possibility of intervening layers, and so on.

Turning now to FIG. 6C, a mask pattern (not shown) is formed on the third ILD layer 455, and then a wet etching process is carried out to selectively form a contact hole 460 which exposes a portion of the etch stop layer 450.

Figure 6D:
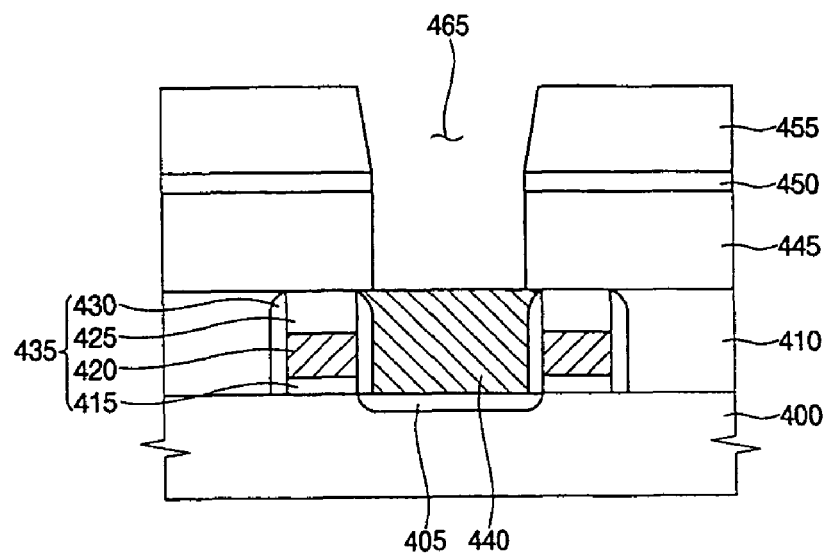

Then, referring to FIG. 6D, a dry etch process is carried out to remove the exposed portion of the etch stop layer 450, and to further remove the underlying portion of the second ILD layer 445. In this manner, a contact hole 465 is defined which exposes the top surface of the first conductive pad 440.

Figure 6E:
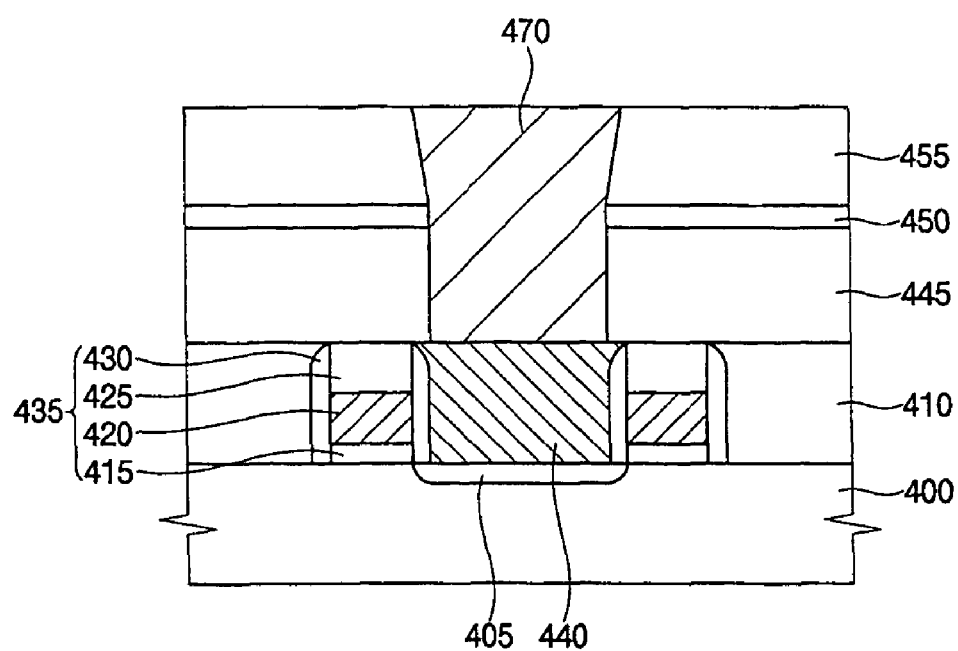

Finally, as shown in FIG. 6E, the contact hole 465 (FIG. 6D) is filled with a second conductive pad 470 which electrically contacts the first conductive pad 440. This may be accomplished by covering the structure of FIG. 6D with a conductive layer that fills the contact hole 465, and then planarizing the conductive layer to expose a top surface of the third ILD layer 455.

The annealed metal oxide etch stop layer 450 exhibits a low wet etch rate. As such, erosion of the etch stop layer 450 is reduced during wet etching of the third ILD layer 455, thus reducing the possibility that wet etchant will permeate into the second ILD layer 445 and perhaps further into the underlying structure. As with previous embodiments, the result is improved device reliability and device yields.

Figure 7A:
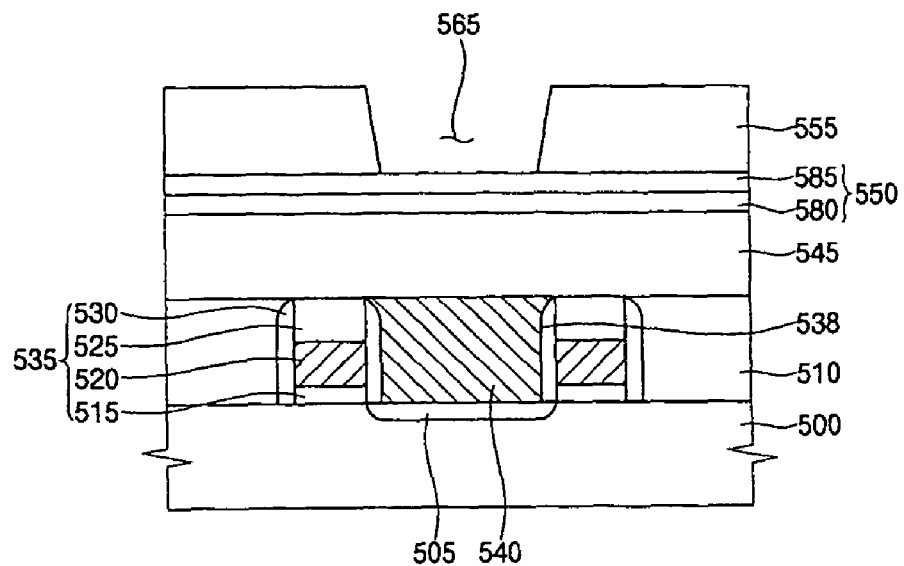
FIGS. 7A through 7B are schematic cross-sectional views for explaining a method of manufacturing a semiconductor device according to another embodiment of the present invention.
Figure 7B:
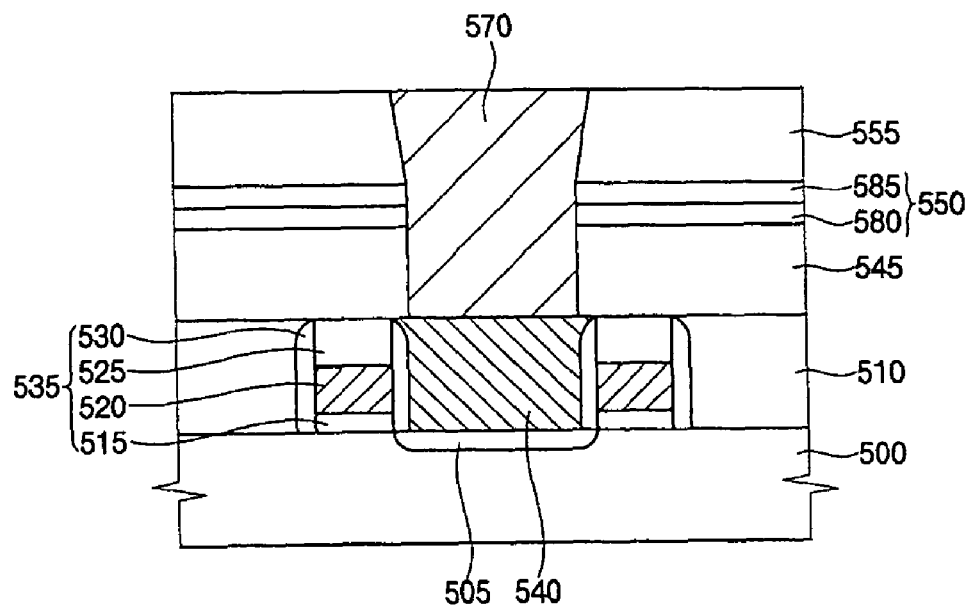

FIGS. 7A through 7B are schematic cross-sectional views for explaining a method of manufacturing a semiconductor device according to another embodiment of the present invention.

Initially, a structure as illustrated in FIG. 7A is prepared. As should be apparent, this structure is similar to that illustrated in previously described FIG. 6C. That is, a semiconductor substrate 500 includes an impurity region 505 in the surface thereof. Gate structures 535 are formed on the surface of the substrate 500 at opposite sides of the impurity region 505. Each of the gate structures 535 is generally formed of a gate oxide 515, a gate electrode 520, a nitride layer 525, and insulating sidewalls 530. Also, as shown, a first ILD layer 510 is formed with its top surface coincident with the top surfaces of the gate structures 535. A self-aligned contact hole is formed between the gate structures 535, and then filled with a first conductive pad 540. The first conductive pad electrically contacts the impurity region 505. A second ILD layer 545, an multilayer etch stop 550, and a third ILD layer 555 are sequentially formed over the first ILD layer 510 and the first conductive pad 540. A mask pattern (not shown) is formed on the third ILD layer 555, and then a wet etching process is carried out to selectively form a contact hole 560 which exposes a portion of the multilayer etch stop 550.

The multilayer etch stop 550 of this embodiment includes first and second etch stop layers 580 and 585, with at least one being an annealed metal oxide layer, and is the same as the multilayer etch stop 215 of the embodiment described previously in connection with FIGS. 4A through 4C. Accordingly, in an effort to avoid redundancy, reference is made to that earlier discussion. The entire discussion relating to the multilayer etch stop 215 of the prior embodiment is applicable to the multilayer etch stop 550 of this embodiment, including discussions relating to method of manufacture, layer materials, the possibility of intervening layers, and so on.

Turning now to FIG. 7B, a dry etch process is carried out to remove the exposed portion of the multilayer etch stop 550, and to further remove the underlying portion of the second ILD layer 545. In this manner, a contact hole is defined which exposes the top surface of the first conductive pad 540. The contact hole is then filled with a second conductive pad 570 which electrically contacts the first conductive pad 540. This may be accomplished by covering the structure with a conductive layer that fills the contact hole, and then planarizing the conductive layer to expose a top surface of the third ILD layer 555.

The annealed metal oxide etch stop layer 580 and/or 585 exhibits a low wet etch rate. As such, erosion of the multilayer etch stop 550 is reduced during wet etching of the third ILD layer 555, thus reducing the possibility that wet etchant will permeate into the second ILD layer 545 and perhaps further into the underlying structure. As with previous embodiments, the result is improved device reliability and device yields.

Figure 8A:
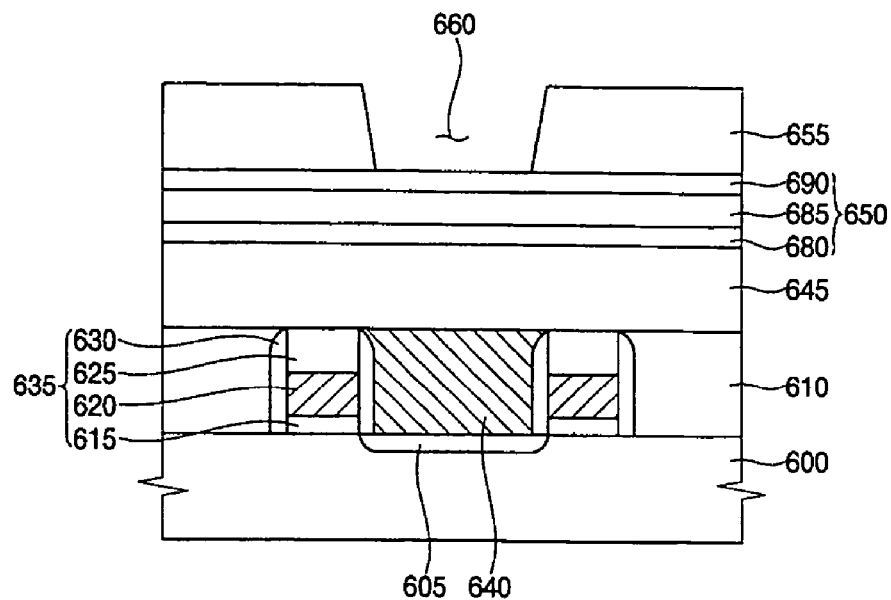
FIGS. 8A through 8B are schematic cross-sectional views for explaining a method of manufacturing a semiconductor device according to another embodiment of the present invention.
Figure 8B:
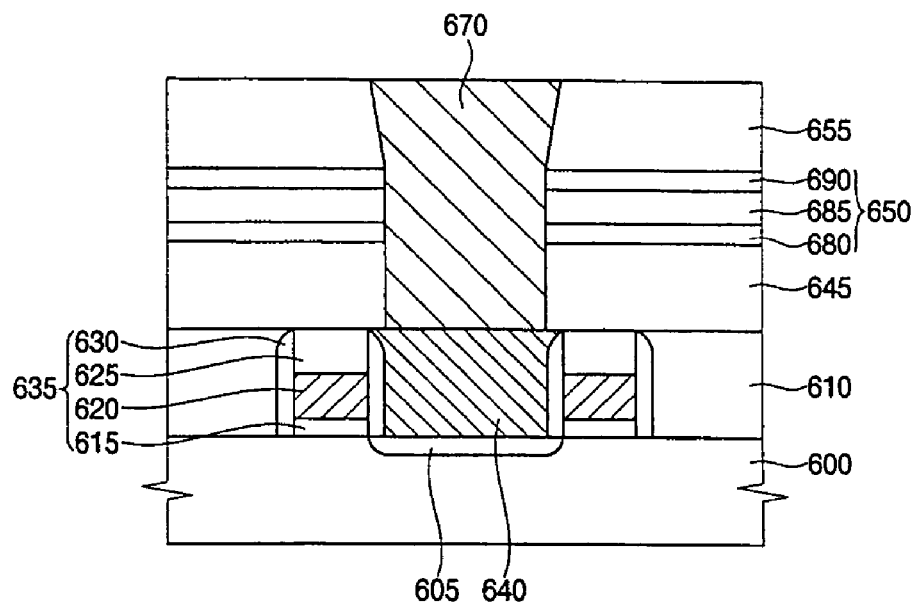

FIGS. 8A through 8B are schematic cross-sectional views for explaining a method of manufacturing a semiconductor device according to another embodiment of the present invention.

Initially, a structure as illustrated in FIG. 8A is prepared. This structure is similar to those illustrated in previously described FIGS. 6C and 7A. As shown, a semiconductor substrate 600 includes an impurity region 605 in the surface thereof. Gate structures 635 are formed on the surface of the substrate 600 at opposite sides of the impurity region 605. Each of the gate structures 635 is generally formed of a gate oxide 615, a gate electrode 620, a nitride layer 625, and insulating sidewalls 630. Also, as shown, a first ILD layer 610 is formed with its top surface coincident with the top surfaces of the gate structures 635. A self-aligned contact hole is formed between the gate structures 635, and then filled with a first conductive pad 640. The first conductive pad electrically contacts the impurity region 605. A second ILD layer 645, a multilayer etch stop 650, and a third ILD layer 655 are sequentially formed over the first ILD layer 610 and the first conductive pad 640. A mask pattern (not shown) is formed on the third ILD layer 655, and then a wet etching process is carried out to selectively form a contact hole 660 which exposes a portion of the multilayer etch stop 650.

The multilayer etch stop 650 of this embodiment includes first and second etch stop layers 680 and 690, with at least one being an annealed metal oxide layer, and an intermediate oxide layer 685. In other words, the multilayer etch stop 650 is the same as the multilayer etch stop 315 of the embodiment described previously in connection with FIGS. 5A through 5B. Therefore, in an effort to avoid redundancy, reference is made to that earlier discussion. The entire discussion relating to the multilayer etch stop 315 of the prior embodiment is applicable to the multilayer etch stop 650 of this embodiment, including discussions relating to method of manufacture, layer materials, the possibility of intervening layers, and so on.

Turning now to FIG. 8B, a dry etch process is carried out to remove the exposed portion of the multilayer etch stop 650, and to further remove the underlying portion of the second ILD layer 645. In this manner, a contact hole is defined which exposes the top surface of the first conductive pad 640. The contact is then filled with a second conductive pad 670 which electrically contacts the first conductive pad 640. This may be accomplished by covering the structure with a conductive layer that fills the contact hole, and then planarizing the conductive layer to expose a top surface of the third ILD layer 655.

The annealed metal oxide etch stop layer 680 and/or 690 exhibits a low wet etch rate. As such, erosion of the multilayer etch stop 650 is reduced during wet etching of the third ILD layer 655, thus reducing the possibility that wet etchant will permeate into the second ILD layer 645 and perhaps further into the underlying structure. As with previous embodiments, the result is improved device reliability and device yields.

FIGS. 9A through 9J are schematic cross-sectional views for explaining a method of manufacturing a memory cell having a cylindrical capacitor electrode according to another embodiment of the present invention.

Figure 9A:
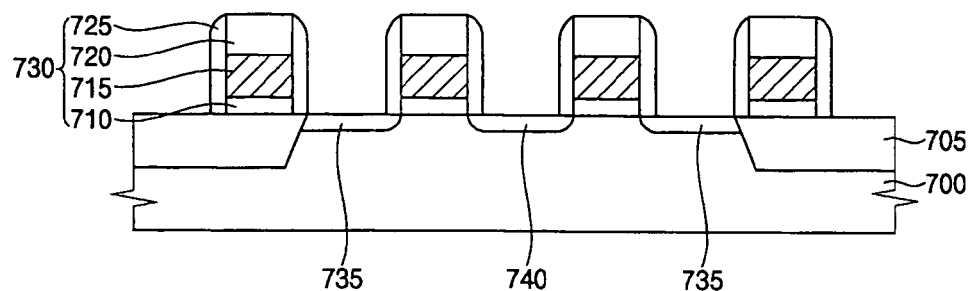
FIGS. 9A through 9J are schematic cross-sectional views for explaining a method of manufacturing a memory cell having a cylindrical capacitor electrode according to another embodiment of the present invention.

Referring first to FIG. 9A, a structure is provided in which a plurality (four, in this example) of gate structures 730 are formed over a semiconductor substrate 700 having an active region defined between isolation regions 705. Each of the gate structures 730 includes a gate insulating layer 710, a gate electrode 715, a nitride layer 720, and insulating sidewalls 725. Impurity diffusion regions 735 and 740 are formed between adjacent pairs of gate structures 730 as shown.

Figure 9B:
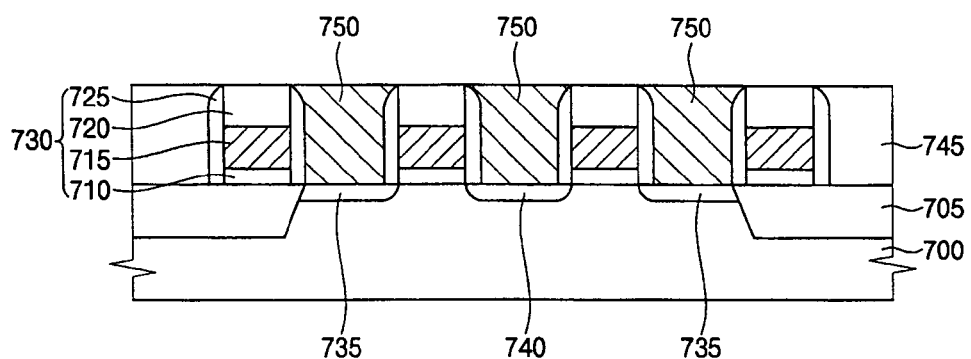

Next, as shown in FIG. 9B, a first ILD layer 745 is formed with its top surface coplanar with the top surfaces of the gate structures 730. A plurality (three, in this example) of self-aligned contact holes are then formed between the gate structures 730, and then filled with first conductive pads 450. The first conductive pads electrically contact the impurity regions 735 and 740 as shown.

Figure 9C:
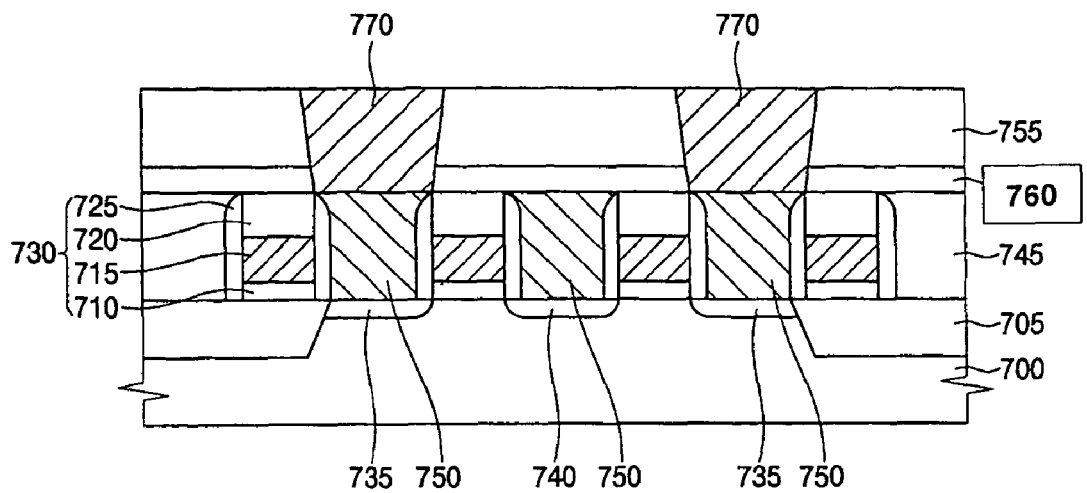

Then, as shown in FIG. 9C, a first etch stop layer 760 and second ILD layer 755 are sequentially formed over the first ILD layer 745 and the first conductive pads 750. In the example of this embodiment, the first etch stop layer 760 is formed of silicon nitride. However, it is also possible to adopt other etch stop layers, such as those described in the previous embodiments of the invention. A patterned mask layer (not shown) is then formed over the first ILD layer 745, and the resultant structure is subjected to a wet etching process so as to selectively expose portions of the etch stop layer 760. Then, the exposed portions of the etch stop layer 760 are removed by a dry etching process. As a result, contact holes are defined in the second ILD layer 755 and the first etch stop layer 760. A conductive layer is deposited over the resultant structure, and then planarized to expose a top surface of the second ILD layer 755. As a result, second conductive pads 770 are defined within the second ILD layer 755 and in electrical contact with the first conductive pads 750.

Figure 9D:
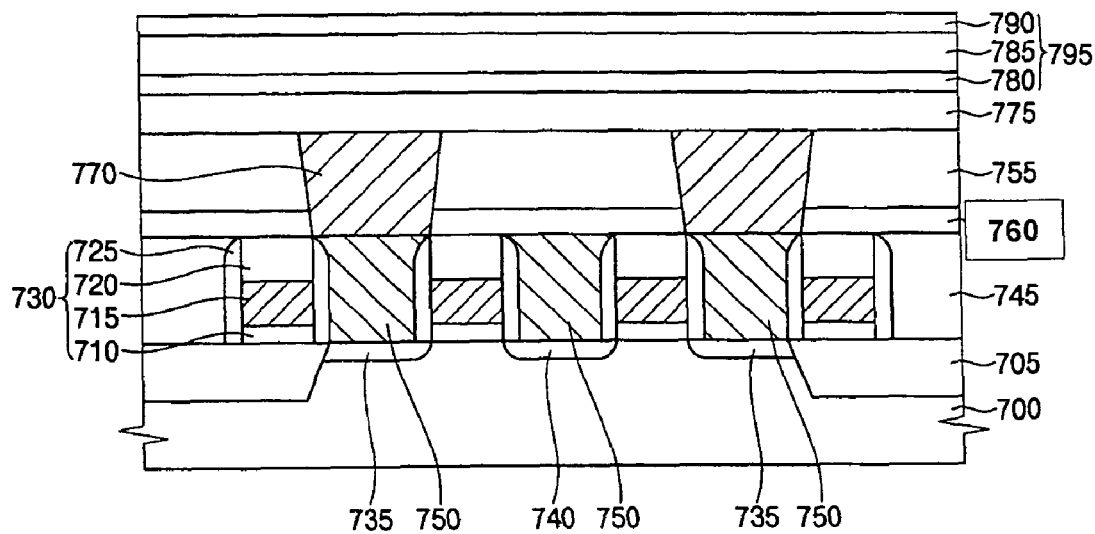

Referring now to FIG. 9D, a third ILD layer 775 and a second multilayer etch stop 795 are sequentially formed over the structure of FIG. 9C. In the example of this embodiment, the second etch stop 775 includes first and second etch stop layers 780 and 790, with at least one being an annealed metal oxide layer, and an oxide layer 785 interposed between the first and second etch stop layers 780 and 790. In other words, the multilayer etch stop 795 is the same as the multilayer etch stop 315 of the embodiment described previously in connection with FIGS. 5A and 5B. Again, in an effort to avoid redundancy, reference is made to that earlier discussion. The entire discussion relating to the multilayer etch stop 315 of the prior embodiment is applicable to the multilayer etch stop 795 of this embodiment, including discussions relating to method of manufacture, layer materials, the possibility of intervening layers, and so on. It is further noted that the etch stop layer 115 of FIG. 3B or the multilayer etch stop 215 of FIG. 4B may be adopted in place of the multilayer etch stop 795 of this embodiment.

Figure 9E:
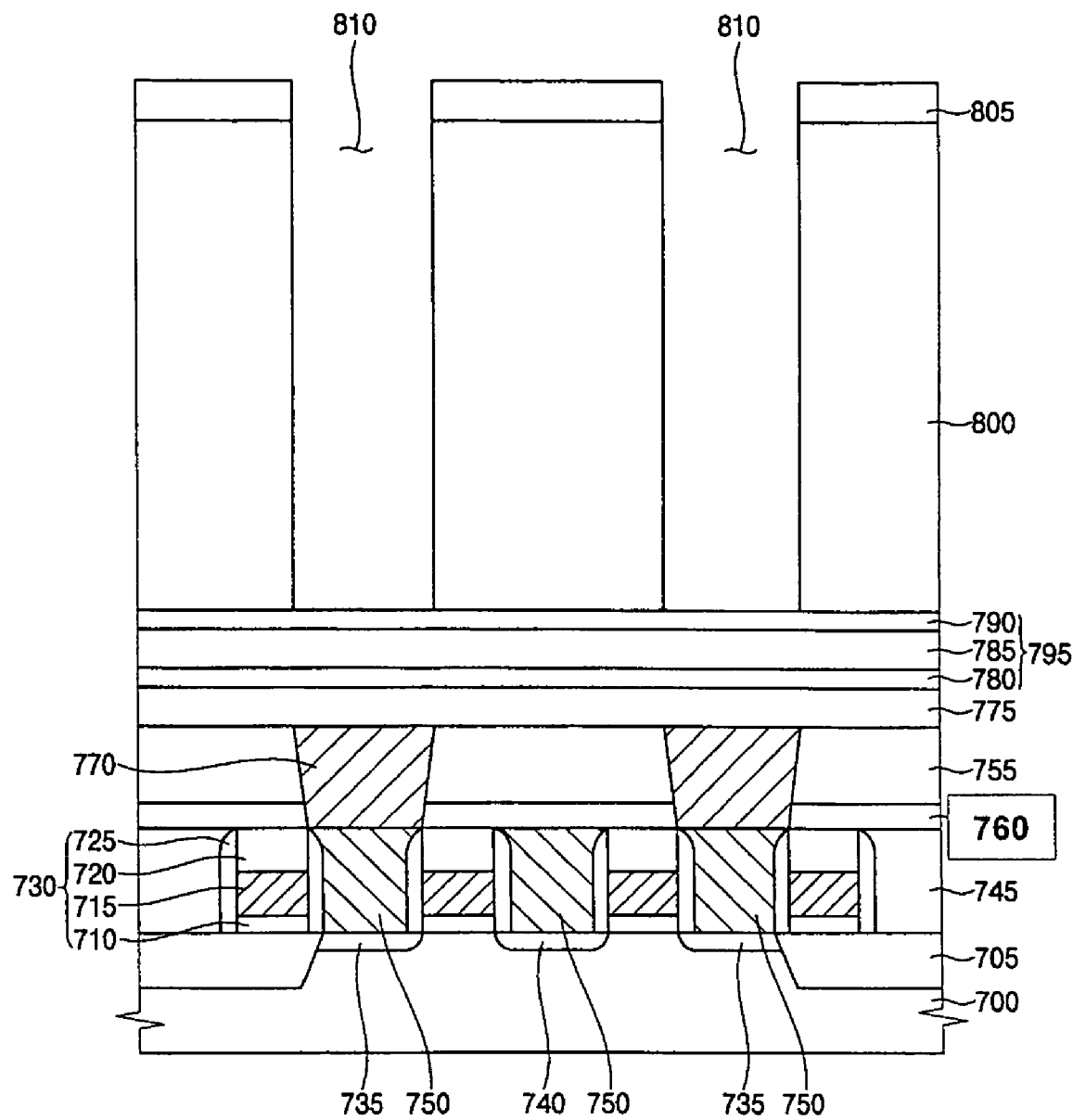

Next, referring to FIG. 9E, a mold layer 800 and an anti-reflection film 805 are sequentially formed over the multilayer etch stop 795. A mask pattern is then formed over the antireflection film 805, and the resultant structure is subject to selective wet etching to define storage node holes 810 which expose respective surface portions of the multilayer etch stop 795.

Figure 9F:
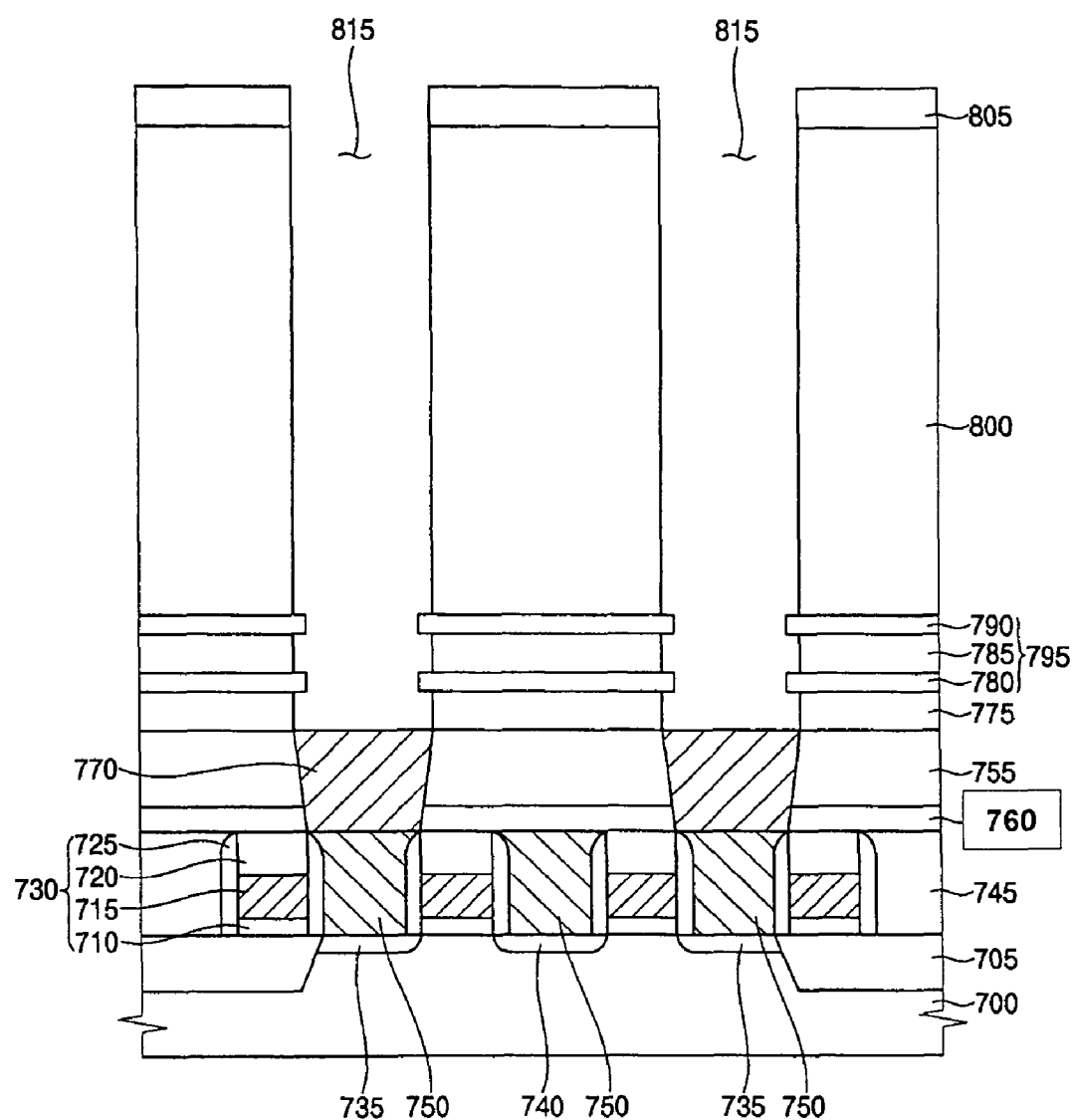

Turning to FIG. 9F, a dry etching is conducted to remove the exposed portion of the multilayer etch stop 975, and the underlying portion of the third ILD layer 775. Note that the etching process may erode sidewalls of the mold layer 800, the oxide layer 785 and the third ILD layer 775, and accordingly, the first and second etch stop layers 780 and 790 may protrude from the sidewalls into the storage node holes 801.

Figure 9G:
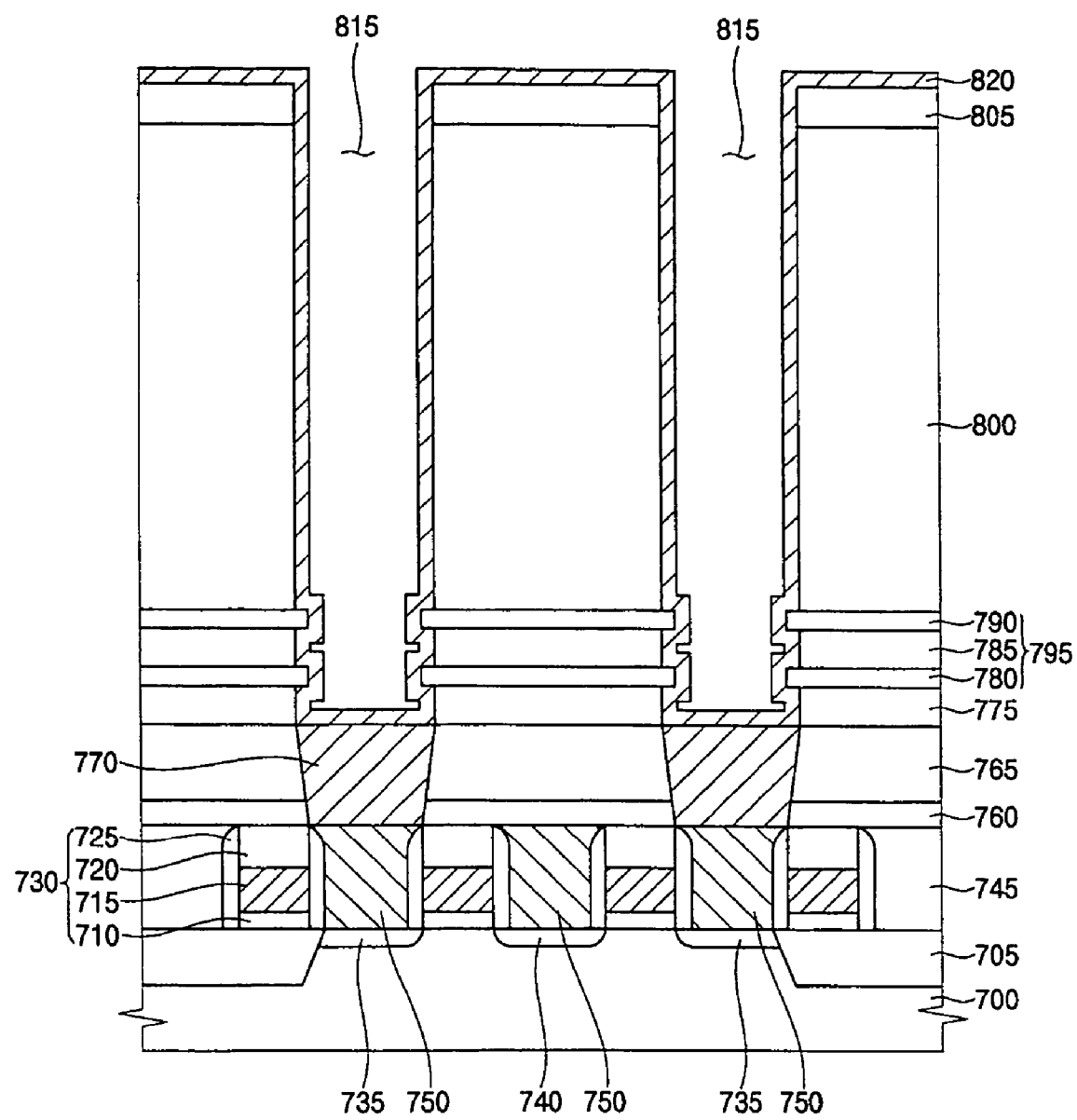

Referring to FIG. 9G, a storage node layer 820 is conformably formed on the inner walls of the storage node holes 815 and on the upper surface of the anti-reflection film 805.

Figure 9H:
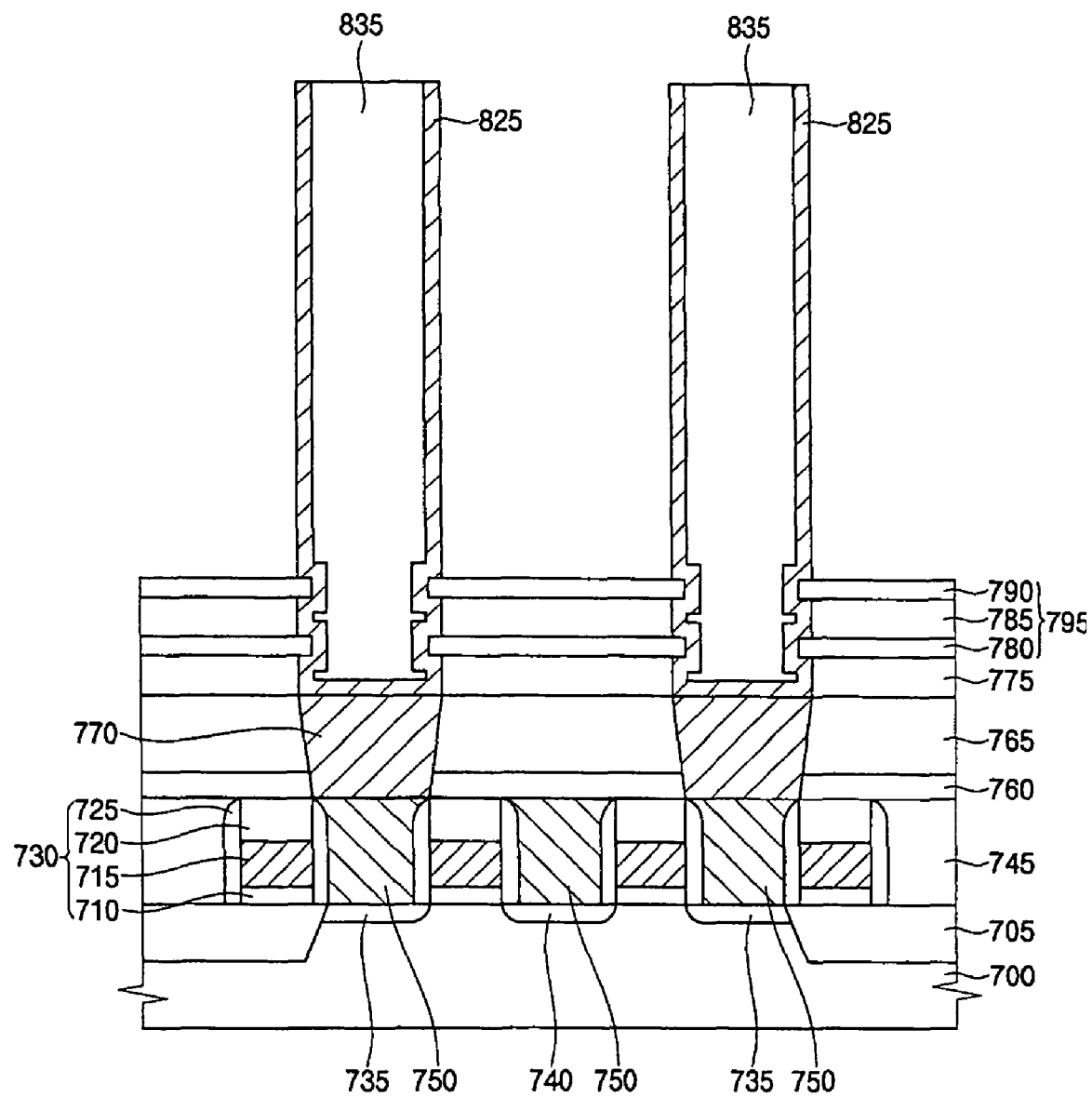

Referring to FIG. 9H, a sacrificial layer 835 is formed on the structure of FIG. 9G so as to fill the storage node holes 815. The resultant structure is then planarized so as to expose the upper surface region of the mold layer 800. The mold layer 800 is then removed by a wet etching process to obtain the structure illustrated in FIG. 9H.

Figure 9I:
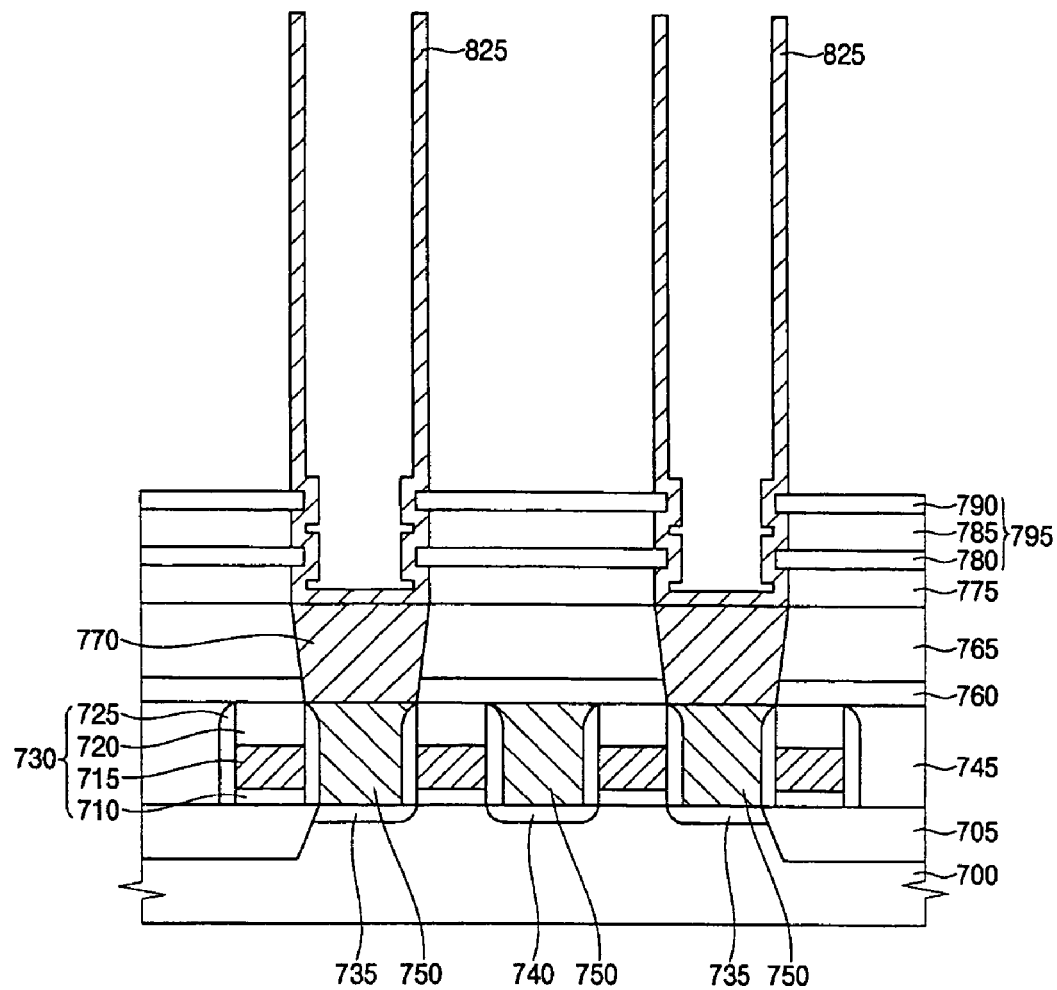

Then, referring to FIG. 9I, an ashing process is carried out to remove the sacrificial layer 835 (FIG. 9H).

Figure 9J:
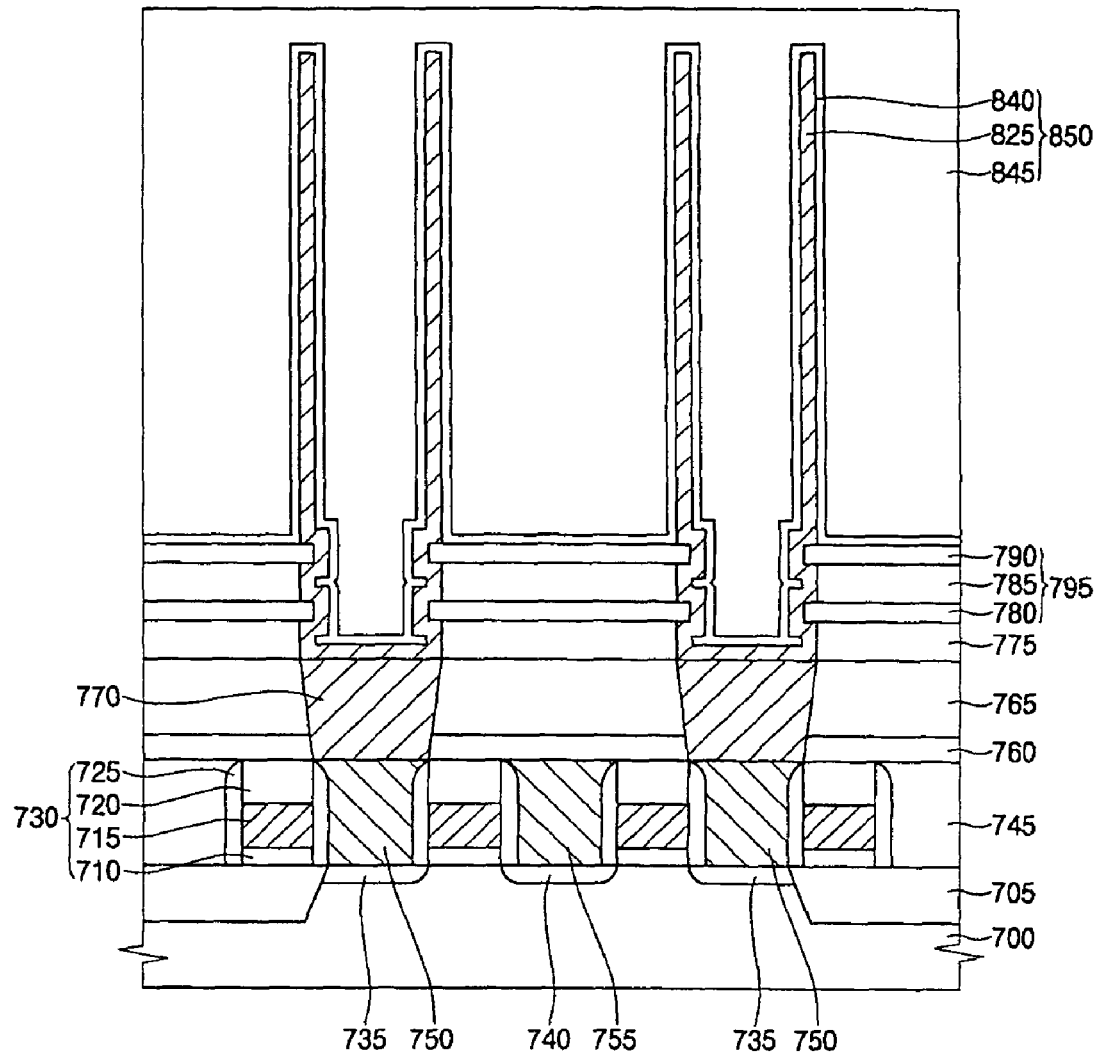

Finally, referring to FIG. 9J, a dielectric layer 840 is conformably formed on the structure of FIG. 9I, and then a plate node layer 845 is formed to define the capacitor 850. That is, each capacitor is defined by the cylindrical storage node layer 825, the dielectric layer 840, and the plate node layer 845.

The annealed metal oxide etch stop layer 780 and/or 790 exhibits a low wet etch rate. As such, erosion of the multilayer etch stop 795 is reduced during wet etching of the mold layer 800, thus reducing the possibility that the wet etchant will permeate into the third ILD layer 775 and perhaps further into the underlying structure. As with previous embodiments, the result is improved device reliability and device yields.

FIGS. 10A through 10F are schematic cross-sectional views for explaining a method of manufacturing a memory cell having a cylindrical capacitor electrode according to another embodiment of the present invention.

Figure 10A:
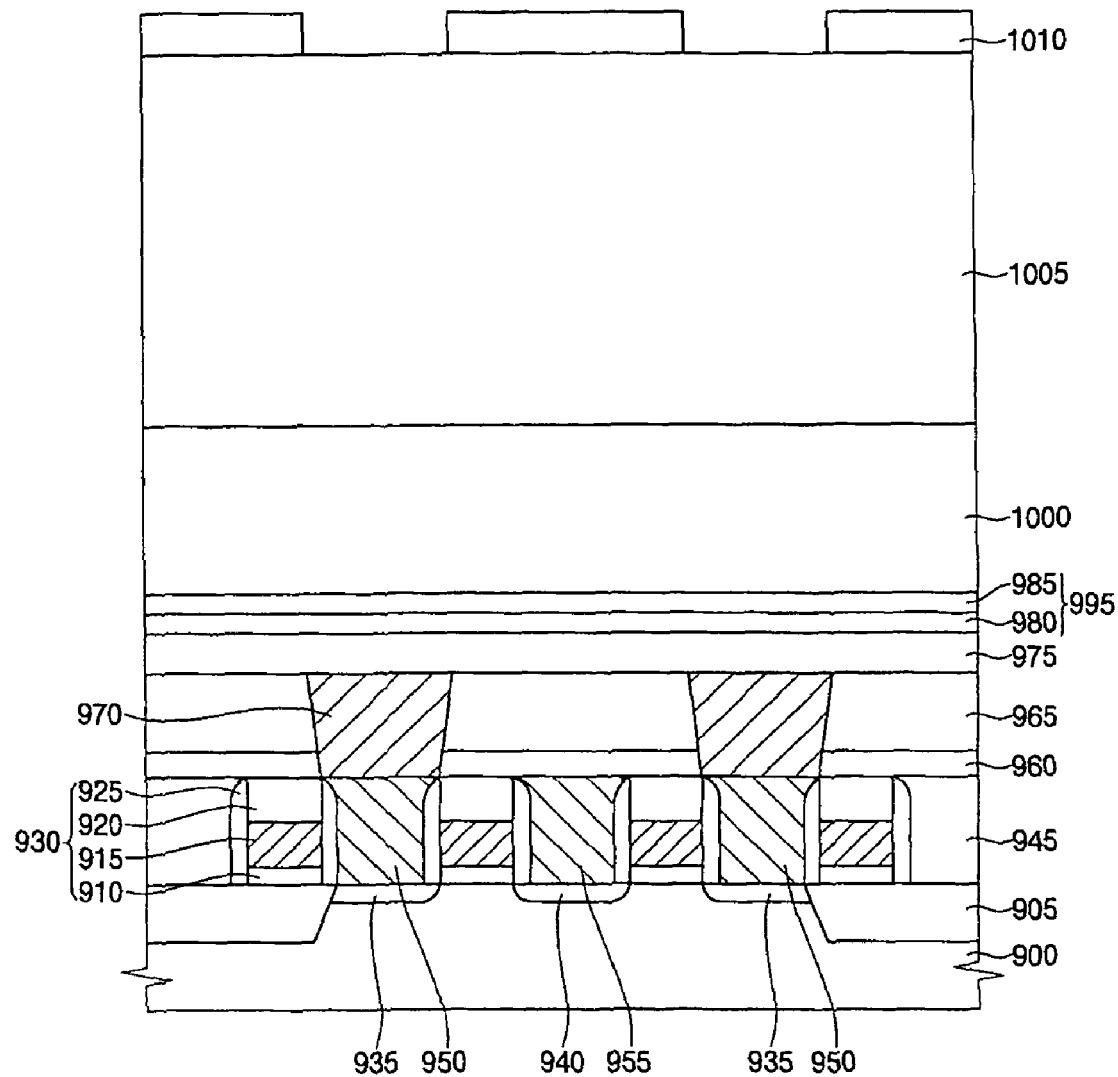
FIGS. 10A through 10F are schematic cross-sectional views for explaining a method of manufacturing a memory cell having a cylindrical capacitor electrode according to another embodiment of the present invention.

In FIG. 10A, reference number 995 denotes a multilayer etch stop. The structure located below the multilayer etch stop 995 of FIG. 10A is similar to the structure located below the multilayer etch stop 795 of previously described FIG. 9D. That is, referring to FIG. 10A, a plurality (four, in this example) of gate structures 930 are formed over a semiconductor substrate 900 having an active region defined between isolation regions 905. Each of the gate structures 930 includes a gate insulating layer 910, a gate electrode 915, a nitride layer 920, and insulating sidewalls 925. Impurity diffusion regions 935 and 940 are formed between adjacent pairs of gate structures 930. Reference number 945 denotes a first ILD layer, and reference number 950 denotes first conductive pads which electrically contact the impurity regions 935 and 940 as shown. A first etch stop layer 960 and a second ILD layer 965 are sequentially located over the first ILD layer 945 and the first conductive pads 950 and 955.

In the example of this embodiment, the first etch stop layer 960 is formed of silicon nitride. However, it is also possible to adopt other etch stop layers, such as those described in the previous embodiments of the invention.

Still referring to FIG. 10A, second conductive pads 970 are defined within the second ILD layer 965 and in electrical contact with the first conductive pads 950. A third ILD layer 975 and the multilayer etch stop 995 are sequentially formed over the third ILD layer 975 as shown. In the example of this embodiment, the multilayer etch stop 995 includes first and second etch stop layers 980 and 985, and is the same as the multilayer etch stop 215 of the embodiment described previously in connection with FIGS. 4A through 4C. Yet again, in an effort to avoid redundancy, reference is made to that earlier discussion. The entire discussion relating to the multilayer etch stop 215 of the prior embodiment is applicable to the multilayer etch stop 995 of this embodiment, including discussions relating to method of manufacture, layer materials, the possibility of intervening layers, and so on. It is further noted that the etch stop layer 115 of FIG. 3B or the multilayer etch stop 315 of FIG. 5A may be adopted in place of the multilayer etch stop 995 of this embodiment.

First and second mold layers 1000 and 1005 are sequentially formed over the multilayer etch stop 995, where an etch rate of the first mold layer 1000 is higher than an etch rate of the second mold layer 1005. Further, a mask pattern 1010 having openings aligned over the second conductive pads 970 is formed over the second mold layer 1005. Although not shown, an anti-reflection film may be formed on the second mold layer 1005.

Figure 10B:
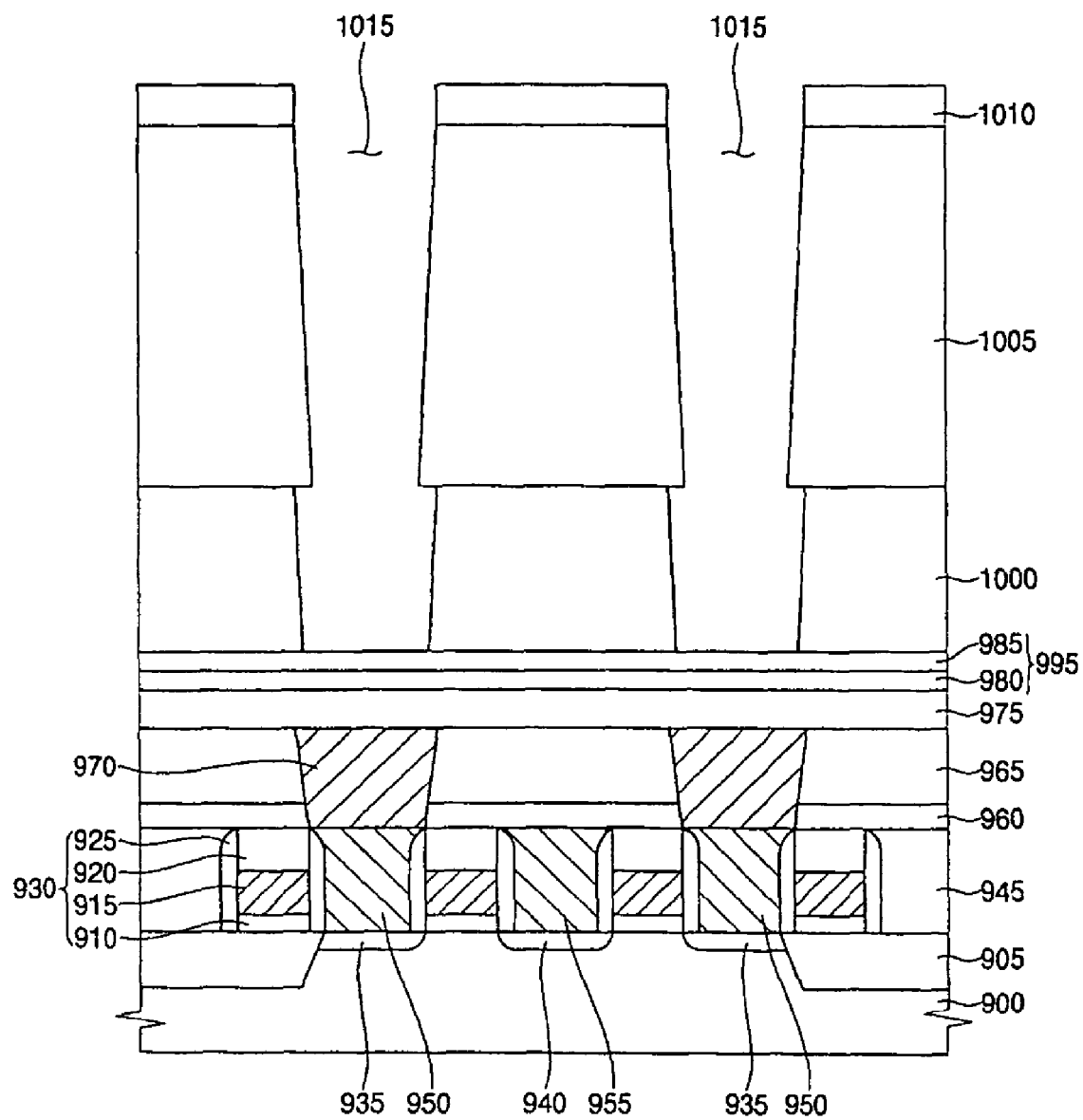

Next, referring to FIG. 10B, the resultant structure is subjected to selective wet etching to define storage node holes 1015 which expose respective surface portions of the multilayer etch stop 995. The differing etch rates of the first and second mold layers 1000 and 1005 result in a partial overlap of the second mold layer 1005 at its interface with the first mold layer 1000.

Figure 10C:
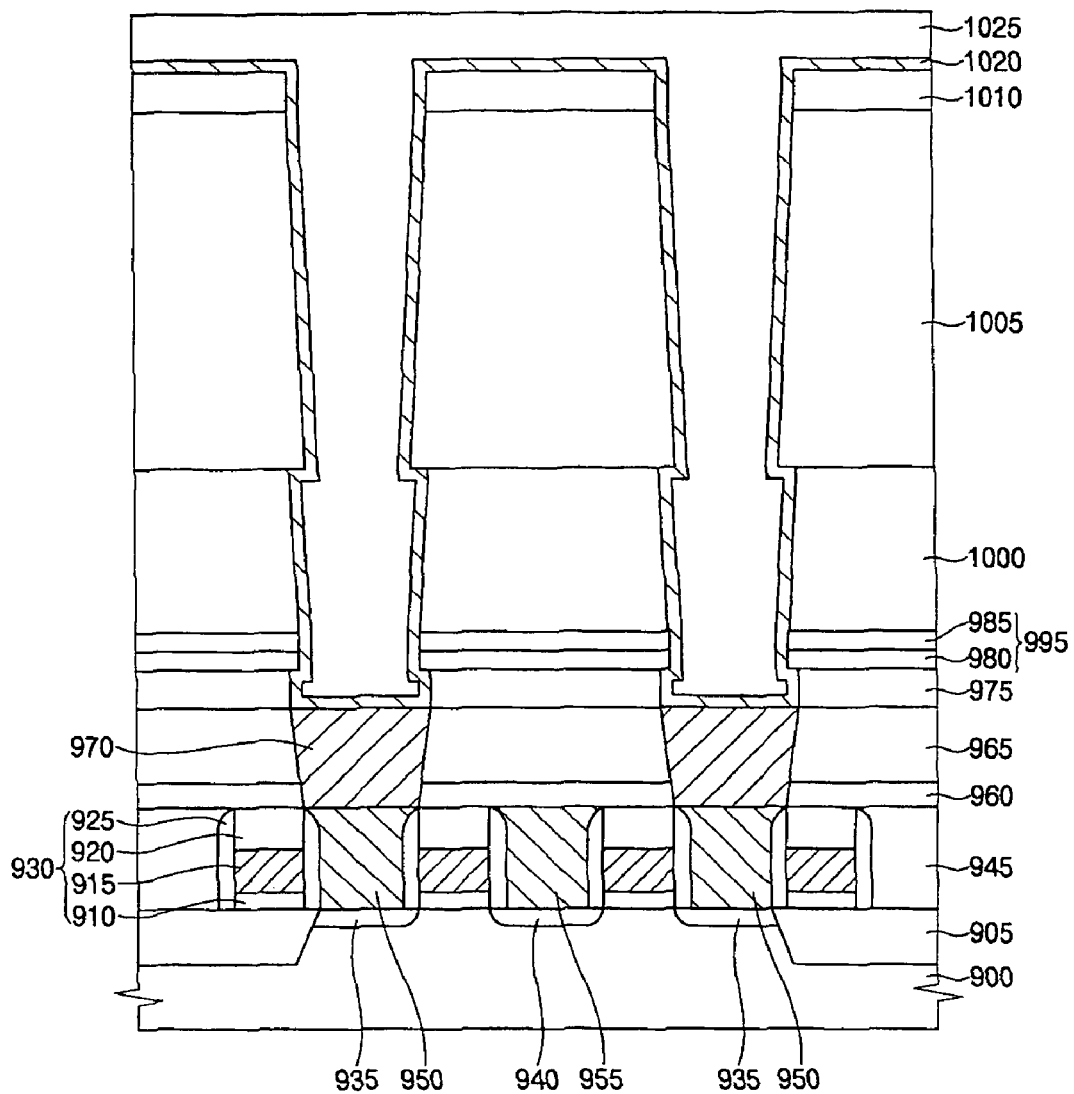

Referring to FIG. 10C, a dry etching is conducted to remove the exposed portion of the multilayer etch stop 995, and the underlying portion of the third ILD layer 975. Note that the etching process may erode sidewalls of the third ILD layer 975, and accordingly, the multilayer etch stop 995 may protrude from the sidewalls into the storage node holes 1015 (FIG. 10B).

Still referring to FIG. 10C, a storage node layer 1030 is conformably formed on the inner walls of the storage node holes 1015 and on the upper surface of the mask pattern 1010. A sacrificial layer 1025 is then formed on the resultant structure so as to fill the storage node holes 1015.

Figure 10D:
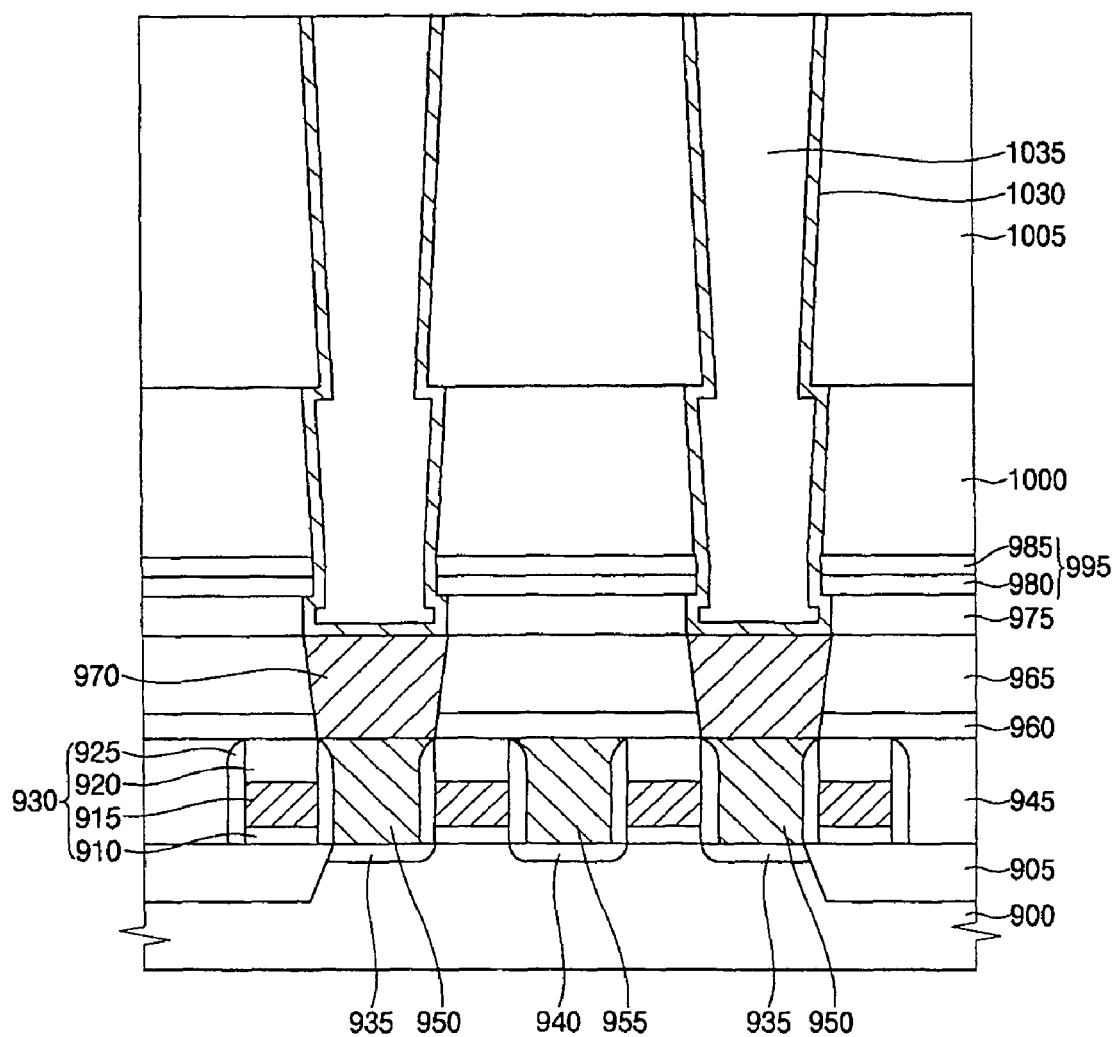

Referring to FIG. 10D, the resultant structure is then planarized so as to expose the upper surface region of the second mold layer 1005.

Figure 10E:
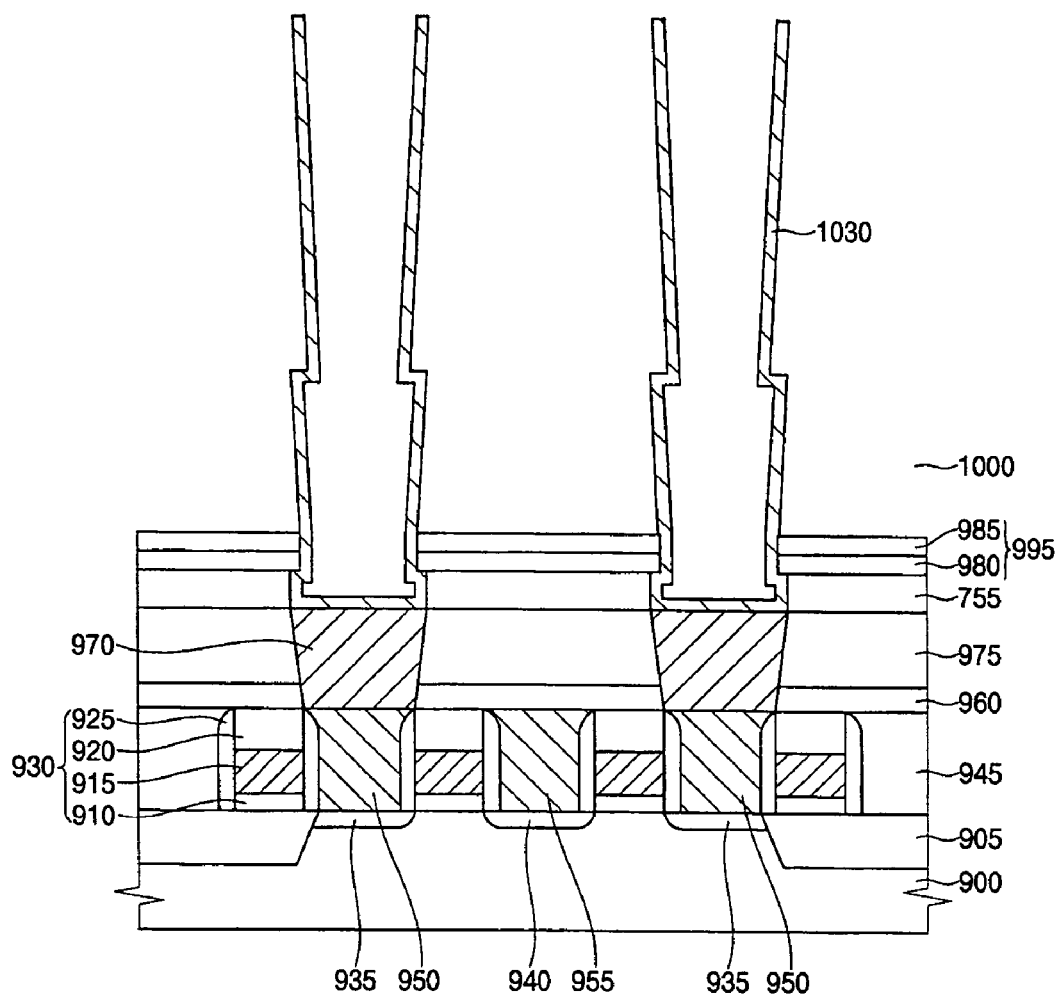

Referring to FIG. 10E, the mold layers 1000 and 1005 are removed by a wet etching process, and an ashing process is carried out to remove the sacrificial layer 1035.

Figure 10F:
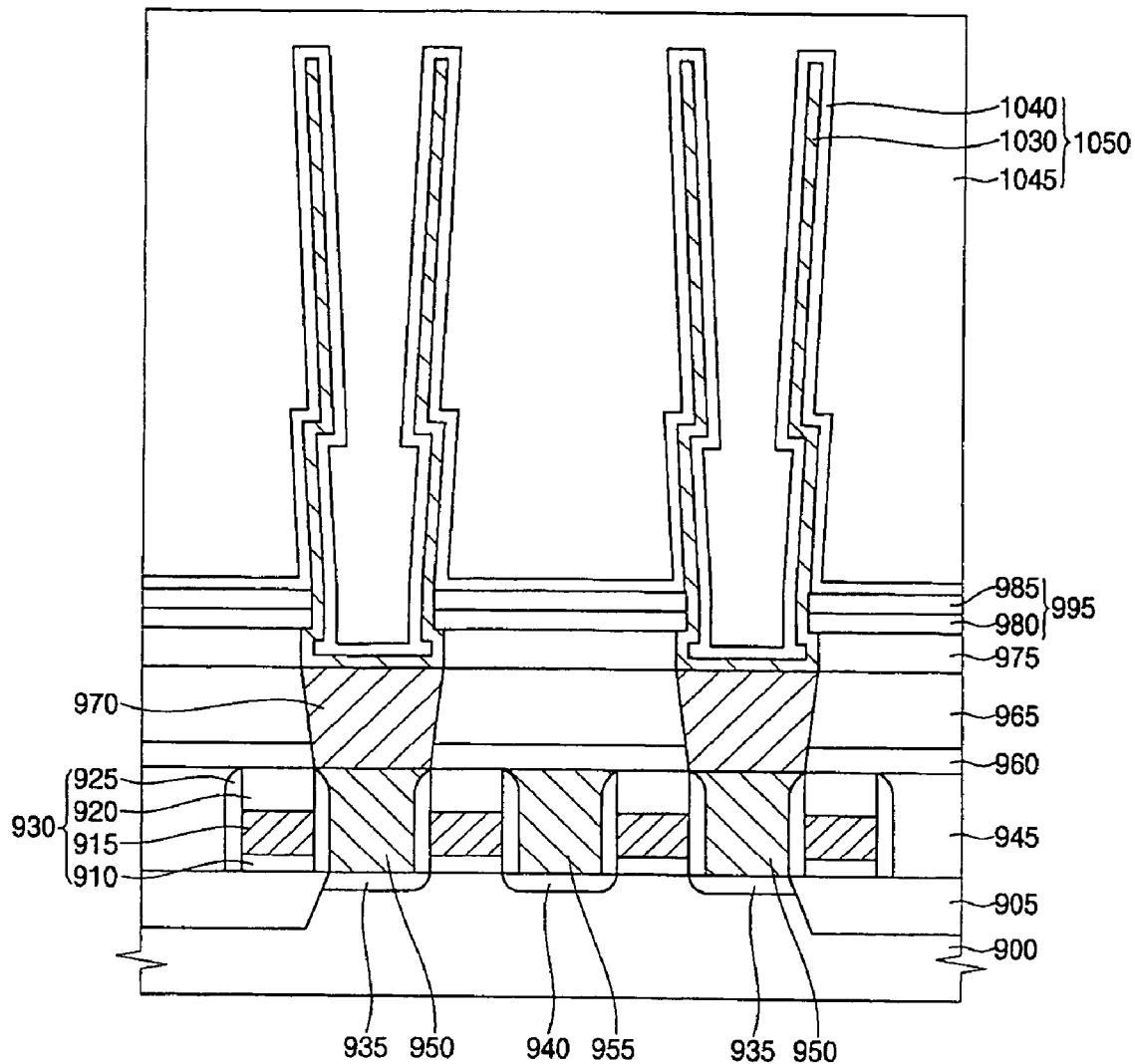

Finally, referring to FIG. 10F, a dielectric layer 1040 is conformably formed on the structure of FIG. 10E, and then a plate node layer 1045 is formed to define a capacitor 1050. That is, each capacitor 1050 is defined by the cylindrical storage node layer 1030, the dielectric layer 1040, and the plate node layer 1045.

The annealed metal oxide etch stop layer 980 and/or 985 exhibits a low wet etch rate. As such, erosion of the multilayer etch stop 995 is reduced during wet etching of the mold layers 1000 and 1005, thus reducing the possibility that wet etchant will permeate into the third ILD layer 975 and perhaps further into the underlying structure. As with previous embodiments, the result is improved device reliability and device yields.

FIGS. 11A through 11D are schematic cross-sectional views for explaining a method of manufacturing a memory cell having a cylindrical capacitor electrode according to another embodiment of the present invention.

Figure 11A:
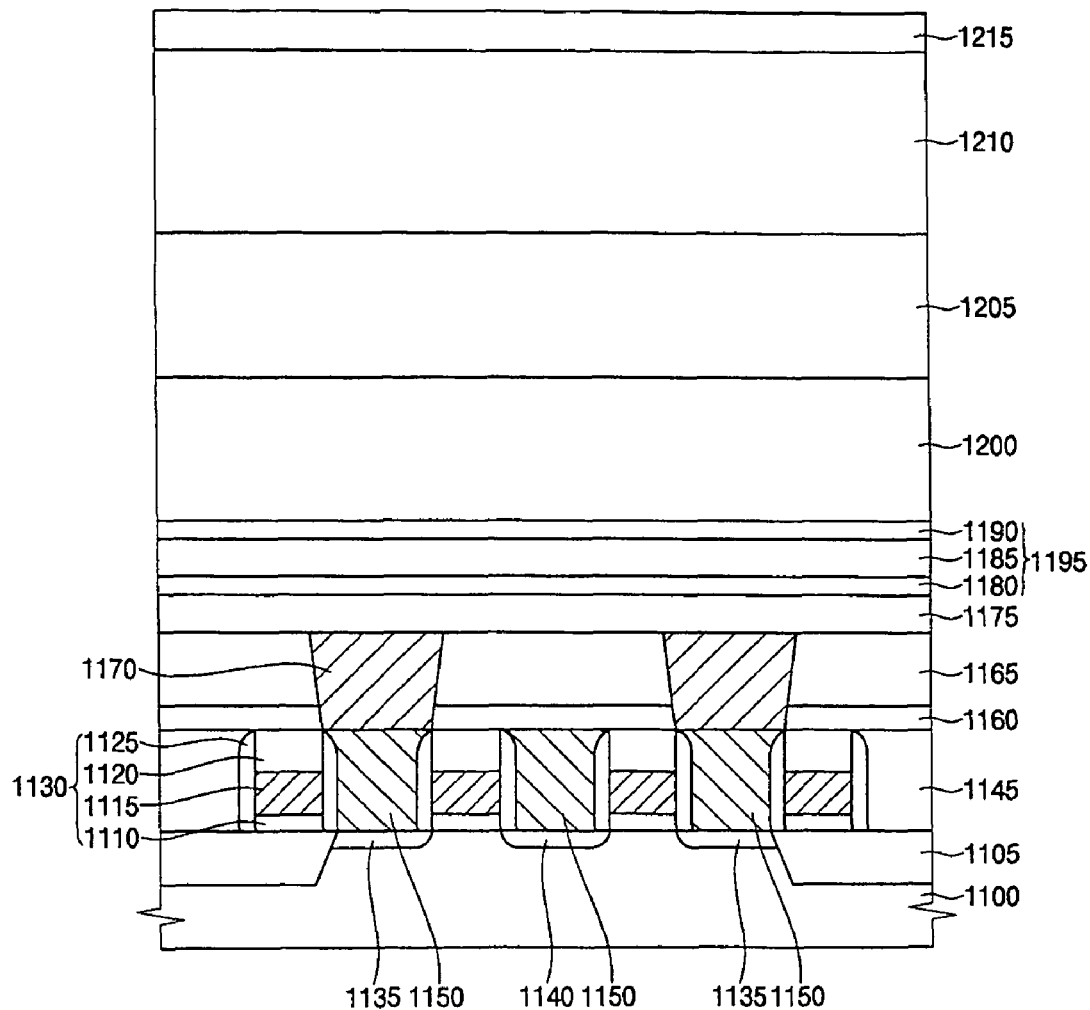
FIGS. 11A through 11D are schematic cross-sectional views for explaining a method of manufacturing a memory cell having a cylindrical capacitor electrode according to another embodiment of the present invention.

In FIG. 11A, reference number 1195 denotes a multilayer etch stop. The structure located below the multilayer etch stop 1195 of FIG. 11A is similar to the structure located below the multilayer etch stop 795 shown in previously described FIG. 9D. That is, referring to FIG. 11A, a plurality (four, in this example) of gate structures 1130 are formed over a semiconductor substrate 1100 having an active region defined between isolation regions 1105. Each of the gate structures 1130 includes a gate insulating layer 1110, a gate electrode 1115, a nitride layer 1120, and insulating sidewalls 1125. Impurity diffusion regions 1135 and 1140 are formed between adjacent pairs of gate structures 1130 as shown. Reference number 1145 denotes a first ILD layer, and reference number 1150 denotes first conductive pads which electrically contact the impurity regions 1135 and 1140 as shown.

A first etch stop layer 1160 and second ILD layer 1165 are sequentially located over the first ILD layer 1145 and the first conductive pads 1150.

In the example of this embodiment, the first etch stop layer 1160 is formed of silicon nitride. However, it is also possible to adopt other etch stop layers, such as those described in the previous embodiments of the invention.

Still referring to FIG. 11A, second conductive pads 1170 are defined within the second ILD layer 1165 and in electrical contact with the first conductive pads 1150 aligned over the impurity regions 1135. A third ILD layer 1175 and the multilayer etch stop 1195 are sequentially formed over the third ILD layer 1175 as shown. In the example of this embodiment, the multilayer etch stop 1195 includes first and second etch stop layers 1180 and 1190, with at least one being an annealed metal oxide layer, and an oxide layer 1185 interposed between the first and second etch stop layers 1180 and 1190. That is, the multilayer etch stop 1195 is the same as the multilayer etch stop 315 of the embodiment described previously in connection with FIGS. 5A and 5B. Once again, in an effort to avoid redundancy, reference is made to that earlier discussion. The entire discussion relating to the multilayer etch stop 315 of the prior embodiment is applicable to the multilayer etch stop 1195 of this embodiment, including discussions relating to method of manufacture, layer materials, the possibility of intervening layers, and so on. It is further noted that the etch stop layer 115 of FIG. 3B or the multilayer etch stop 215 of FIG. 4B may be adopted in place of the multilayer etch stop 1195 of this embodiment.

First, second and third mold layers 1200, 1205 and 1210, and an anti-reflection film 1215 are sequentially formed over the multilayer etch stop 1195. Here, the etch rate of the first mold layer 1200 is higher than an etch rate of the second mold layer 1205, and an etch rate of the second mold layer 1205 is higher than an etch rate of the third mold layer 1210.

Figure 11B:
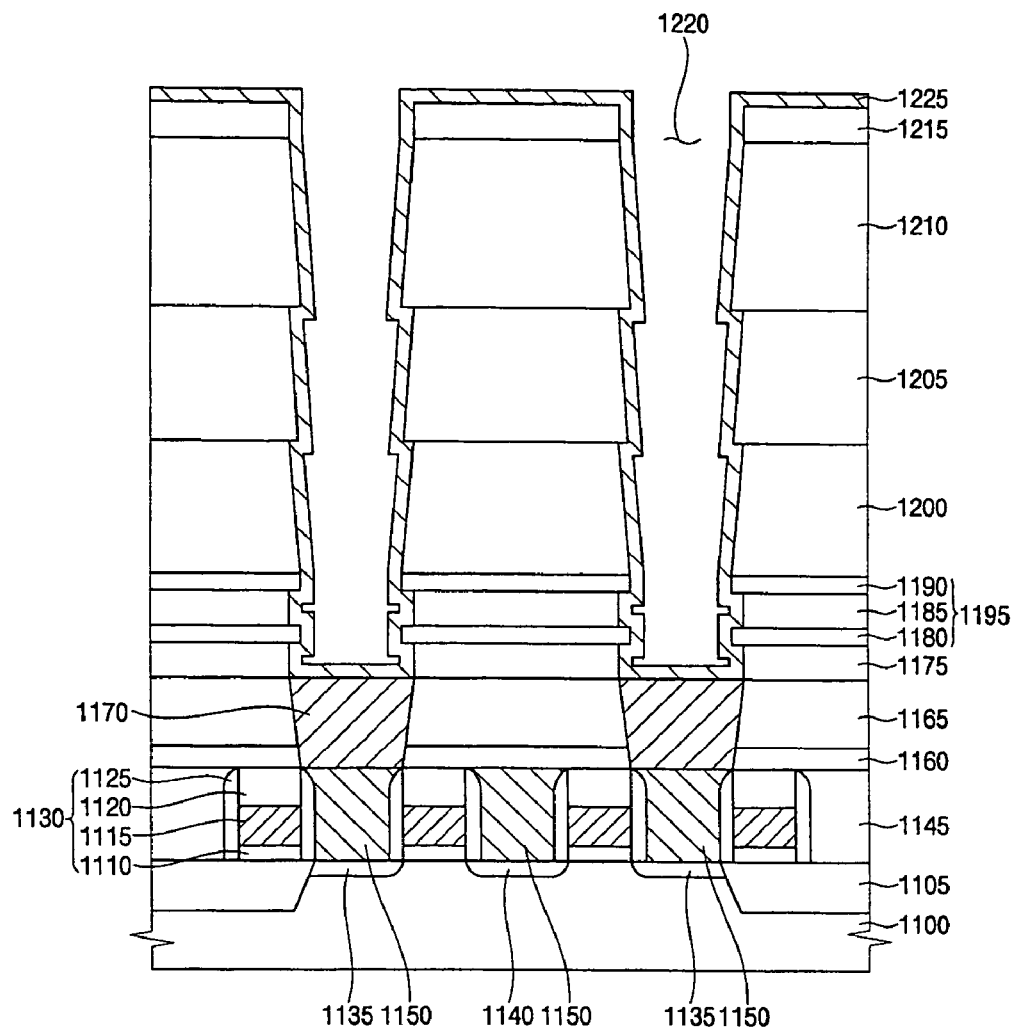

Next, referring to FIG. 11B, the resultant structure is subjected to selective etching processes to define storage node holes 1220 which expose respective surface portions second conductive pads 1170. Note that the etching processes may erode sidewalls of the oxide layer 1185 and the third ILD layer 1175, and accordingly, the multilayer etch stop 1195 may protrude from these sidewalls into the storage node holes 1220.

Still referring to FIG. 11B, a storage node layer 1225 is conformably formed on the inner walls of the storage node holes 1220 and on the upper surface of the anti-reflection film 1215.

Figure 11C:
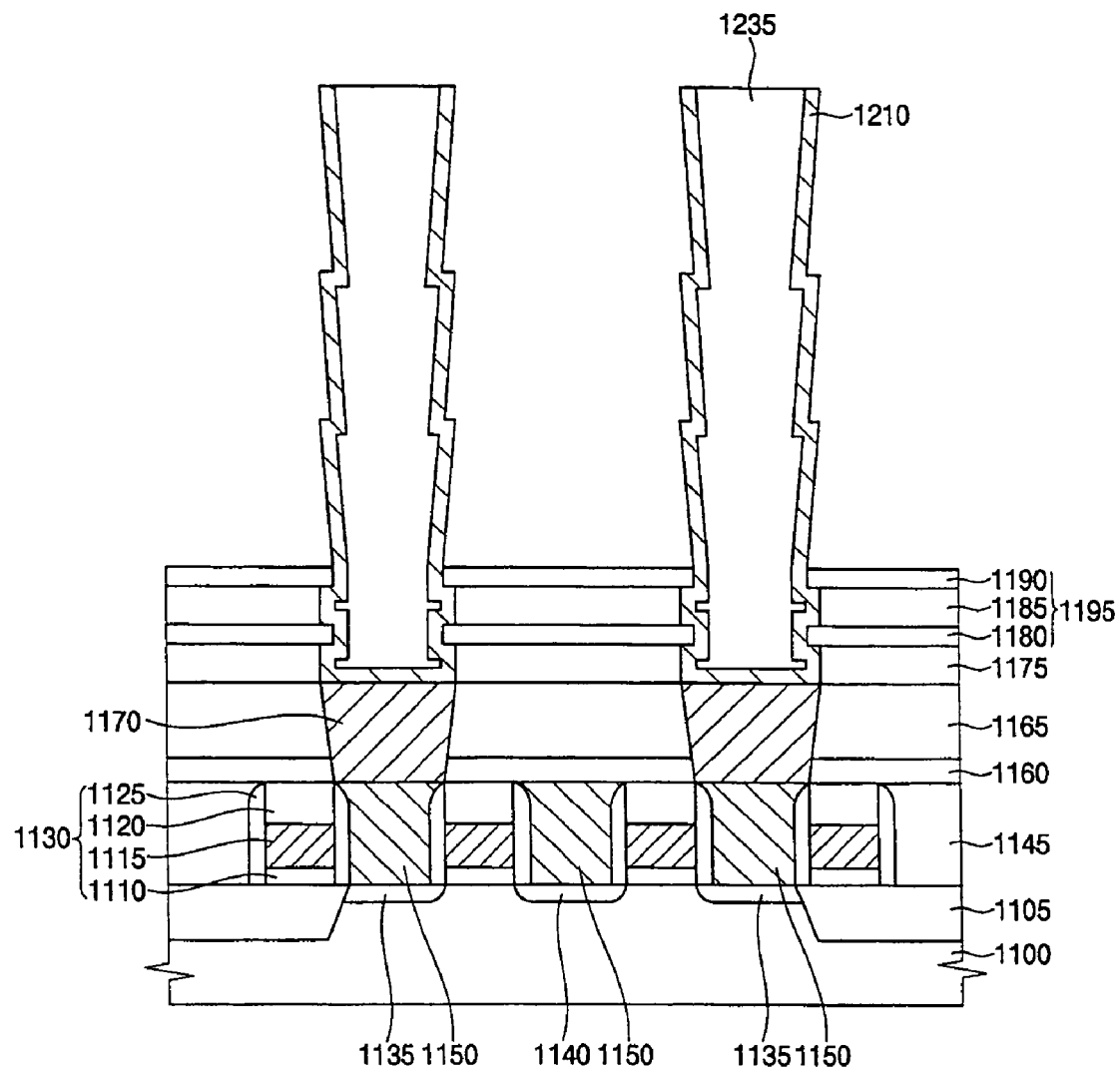

Referring to FIG. 11C, a sacrificial layer 1235 is then formed so as to fill the storage node holes 1220 (FIG. 11B). The resultant structure is then planarized, and the mold layers 1200, 1205 and 1210 are removed by a wet etching process.

Figure 11D:
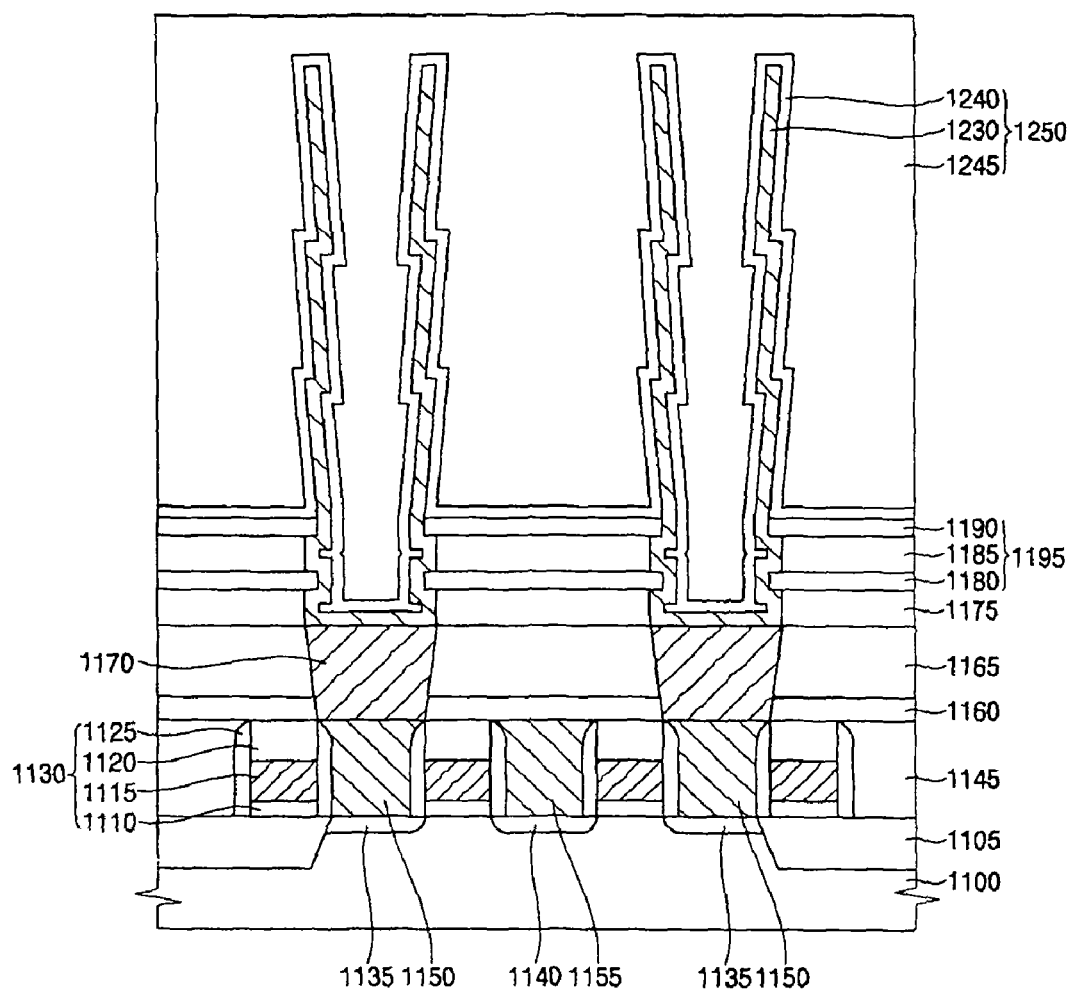

Finally, referring to FIG. 11D, an ashing process is carried out to remove the sacrificial layer 1235 (FIG. 11C), and then a dielectric layer 1240 is conformably formed on the resultant structure. A plate node layer 1245 is then formed to define a capacitor 1250. That is, each capacitor 1250 is defined by the cylindrical storage node layer 1230, the dielectric layer 1240, and the plate node layer 1245.

The annealed metal oxide etch stop layer 1180 and/or 1190 exhibits a low wet etch rate. As such, erosion of the multilayer etch stop 1195 is reduced during wet etching of the mold layers 1200, 1205 and 1210, thus reducing the possibility that the wet etchant will permeate into the third ILD layer 1175 and perhaps further into the underlying structure. As with previous embodiments, the result is improved device reliability and device yields.

Each of the forgoing embodiments includes annealing of at least one metal oxide layer to obtain an etch stop layer which is substantially resistant to wet etching. Here, substantially resistant to wet etching means that the etch stop layer is capable of functioning as a wet etch stop during the manufacture of a semiconductor device. Although the invention is not so limited, it is preferred that the annealed metal oxide layer exhibit an etch rate of less than 1 Å per minute when exposed during a wet etch process to 200:1 diluted hydrofluoric acid (HF), Standard Clean 1 (SC1: ammonium hydroxide ($NH_4OH$), hydrogen peroxide ($H_2O_2$) and water), or sulfuric acid ($H_2SO_4$).

Also, although the invention is not so limited, it is preferable that the anneal temperature is less than 700° C., more preferable that the anneal temperature is less than 600° C., and even more preferable that the anneal temperature is less than 520° C. Further, although the invention is not so limited, it is preferable that the anneal time is less than 10 minutes, more preferable that the anneal time is less than 5 minutes, and even more preferable that the anneal time is less than 2 minutes.

Although the present invention has been described above in connection with the preferred embodiments thereof, the present invention is not so limited. Rather, various changes to and modifications of the preferred embodiments will become readily apparent to those of ordinary skill in the art. Accordingly, the present invention is not limited to the preferred embodiments described above. Rather, the true spirit and scope of the invention is defined by the accompanying claims.

What is claimed is:

1. A method of manufacturing a semiconductor device, comprising:
    forming an etch stop layer over a first structure by depositing a metal oxide material over the first structure, and annealing the deposited metal oxide material;
    forming a second structure over the etch stop layer; and
    etching a formation through the second structure using the etch stop layer as an etch stop,
    wherein said annealing is carried out before formation of the second structure and wherein the etch stop layer is formed to a first etch stop layer and a second etch stop layer, and
    wherein the first etch stop layer is a hafnium oxide ($HfO_2$) layer, and the second etch stop layer is an aluminum oxide ($Al_2O_3$) layer.

2. A method of manufacturing a semiconductor device, comprising:
    forming an etch stop layer over a first structure by depositing a metal oxide material over the first structure, and annealing the deposited metal oxide material;
    forming a second structure over the etch stop layer; and
    etching a formation through the second structure using the etch stop layer as an etch stop
    wherein said annealing is carried out before formation of the second structure and the etch stop layer is formed to include an aluminum oxide ($Al_2O_3$) layer, and
    wherein the $Al_2O_3$ layer is formed directly on the first structure and the second structure is formed directly on the $Al_2O_3$ layer.

3. A method of manufacturing a semiconductor device, comprising:
    forming an etch stop layer over a first structure by depositing a metal oxide material over the first structure, and annealing the deposited metal oxide material;
    forming a second structure over the etch stop layer; and
    etching a formation through the second structure using the etch stop layer as an etch stop,
    wherein said annealing is carried out before formation of the second structure and eth etch stop layer is formed to include a first etch stop layer and a second etch stop layer, and
    wherein the first etch stop layer is a hafnium oxide ($HfO_2$) layer, and the second etch stop layer is a silicon nitride layer.

4. A method of manufacturing a semiconductor device, comprising:
    forming an etch stop layer over a first structure by depositing a metal oxide material over the first structure, and annealing the deposited metal oxide material;
    forming a second structure over the etch stop layer; and
    etching a formation through the second structure using the etch stop layer as an etch stop,
    wherein said annealing is carried out before formation of the second structure and the etch stop layer is formed to include a first etch stop layer and a second etch stop layer, and
    wherein the first etch stop layer is an $Al_2O_3$ layer, and the second etch stop layer is a silicon nitride layer.

5. The method of claim 1, wherein the etch stop layer further includes an oxide buffer layer located between the first and second etch stop layers.

6. The method of claim 3, wherein the etch stop layer further includes an oxide buffer layer located between the first and second etch stop layers.

7. A method of manufacturing a semiconductor device, comprising:
    forming a first interlayer dielectric (ILD) layer over the surface of a substrate;
    forming a first conductive layer within a first contact hole of the first ILD layer;
    forming an etch stop layer over the first ILD layer and the first conductive layer, wherein the etch stop layer is formed by depositing a metal oxide material, and annealing the deposited metal oxide material, and wherein the etch stop layer is formed to include a first etch stop layer and a second etch stop layer;
    forming a second ILD layer over the etch stop layer;
    etching a second contact hole in the second ILD layer using the etch stop layer as an etch stop, wherein the second contact hole is aligned over the first conductive layer;
    removing an exposed portion of the etch stop layer within the second contact hole; and
    forming a second conductive layer in the second contact hole which electrically contacts the first conductive layer; and
    further comprising forming an oxide buffer layer between the first and second etch stop layers.

8. The method of claim 7, wherein said etching of the second contact hole includes wet etching, and wherein said removing of the exposed portion of the etch stop layer includes dry etching.

9. The method of claim 7, wherein said metal oxide material comprises at least one of hafnium and aluminum.

10. The method of claim 7, wherein at least one of the first and second etch stop layers is a metal oxide layer.

11. The method of claim 4, wherein the etch stop layer further includes an oxide buffer layer located between the first and second etch stop layers.

* * * * *